US011081474B1

(12) United States Patent
Hoang et al.

(10) Patent No.: US 11,081,474 B1
(45) Date of Patent: Aug. 3, 2021

(54) DYNAMIC RESOURCE MANAGEMENT IN CIRCUIT BOUND ARRAY ARCHITECTURE

(71) Applicant: SANDISK TECHNOLOGIES LLC, Addison, TX (US)

(72) Inventors: Tung Thanh Hoang, San Jose, CA (US); Martin Lueker-Boden, Fremont, CA (US); Anand Kulkarni, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/862,472

(22) Filed: Apr. 29, 2020

(51) Int. Cl.
| | |
|---|---|
| *G11C 5/06* | (2006.01) |
| *H01L 25/18* | (2006.01) |
| *G11C 16/34* | (2006.01) |
| *G11C 16/04* | (2006.01) |
| *G11C 16/26* | (2006.01) |
| *G11C 16/10* | (2006.01) |
| *G11C 16/24* | (2006.01) |
| *G11C 16/08* | (2006.01) |

(52) U.S. Cl.
CPC .......... *H01L 25/18* (2013.01); *G11C 16/0483* (2013.01); *G11C 16/08* (2013.01); *G11C 16/10* (2013.01); *G11C 16/24* (2013.01); *G11C 16/26* (2013.01); *G11C 16/3459* (2013.01)

(58) Field of Classification Search
CPC ....... G11C 5/063; G11C 7/18; G11C 11/4097; G11C 5/025; G11C 5/04
USPC .......................................................... 365/63
See application file for complete search history.

(56) References Cited

U.S. PATENT DOCUMENTS

| | | | |
|---|---|---|---|
| 8,737,141 B2* | 5/2014 | Melik-Martirosian | ...................... G11C 16/12 365/189.011 |
| 2017/0364469 A1* | 12/2017 | Crisp | .................. G06F 13/4068 |

* cited by examiner

*Primary Examiner* — Son T Dinh
(74) *Attorney, Agent, or Firm* — Vierra Magen Marcus LLP

(57) ABSTRACT

Systems and methods for dynamically assigning memory array die to CMOS die of a plurality of stacked die during memory operations are described. The plurality of stacked die may be vertically stacked and connected together via one or more vertical through-silicon via (TSV) connections. The memory array die may only comprise memory cell structures (e.g., vertical NAND strings) without column decoders, row decoders, charge pumps, sense amplifiers, control circuitry, page registers, or state machines. The CMOS die may contain support circuitry necessary for performing the memory operations, such as read and write memory operations. The one or more vertical TSV connections may allow each memory array die of the plurality of stacked die to communicate with or be electrically connected to one or more CMOS die of the plurality of stacked die.

20 Claims, 15 Drawing Sheets

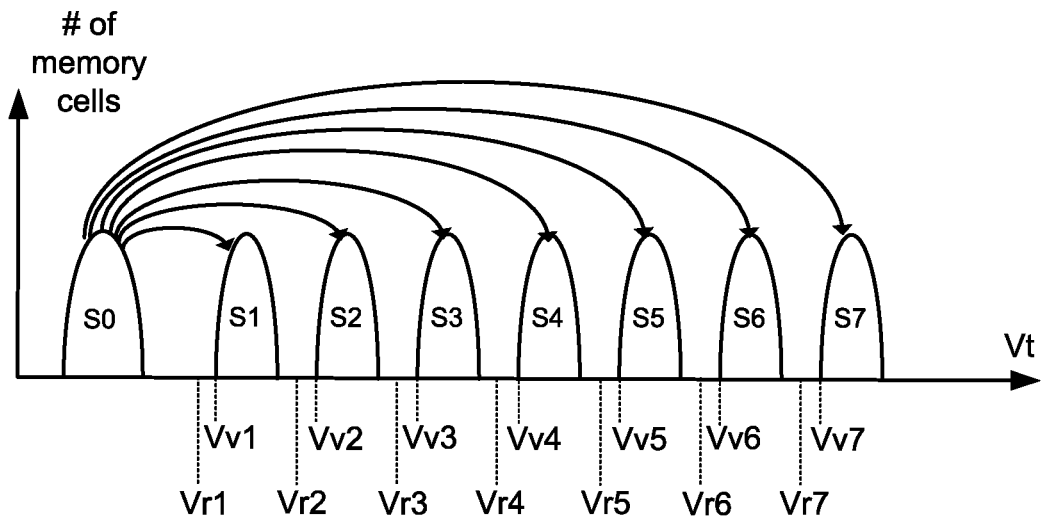
FIG. 5
|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |
FIG. 6A
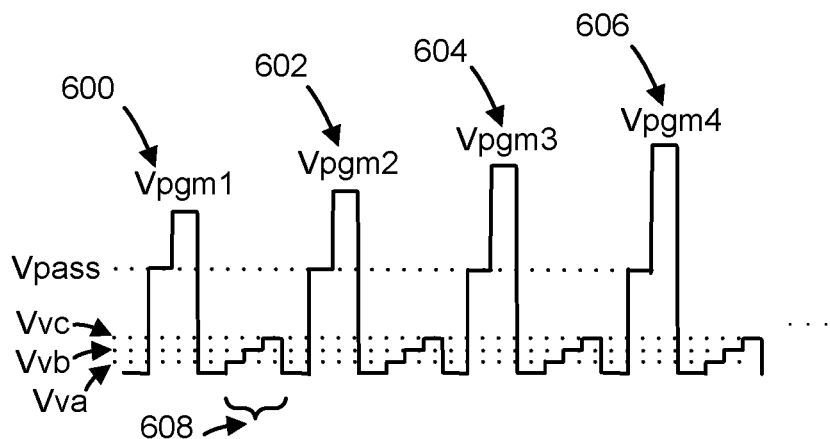
FIG. 6B

DYNAMIC RESOURCE MANAGEMENT IN CIRCUIT BOUND ARRAY ARCHITECTURE

BACKGROUND

The growth in demand for portable consumer electronics is driving the need for high-capacity storage devices. Non-volatile semiconductor memory devices, such as flash memory storage cards, are widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs, cellular telephones and solid state drives (SSDs). Semiconductor memory devices may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory) and Electrically Erasable Programmable Read-Only Memory (EEPROM).

It is common for semiconductor memory die to be placed into a package to allow for easier handling and assembly, and to protect the die from damage. Although a plural form of "die" is "dice," it is common industry practice to use "die" as a plural form as well as the singular form. In one example, one or more semiconductor memory die and other integrated circuits, such as processors, may be encased within a package wherein the die may be stacked on top of one another within the package. The package may comprise a surface-mount package, such as a BGA package or TSOP package. One benefit of vertically stacking numerous die within a package (e.g., stacking eight die within a single package) is that the overall form factor and package size may be reduced. In some cases, the package may comprise a stacked multi-chip package, a system-in-package (SiP), or a chip stack multichip module (MCM). Vertical connections between the stacked die including direct vertical connections through a die's substrate (e.g., through a silicon substrate) may be formed within each die before or after die-to-die bonding. The vertical connections may comprise through-silicon vias (TSVs).

BRIEF DESCRIPTION OF THE DRAWINGS

Like-numbered elements refer to common components in the different figures.

FIG. 5 depicts threshold voltage distributions.

FIG. 6A is a table describing one example of an assignment of data values to data states.

FIG. 6B depicts one embodiment of a series of program and verify pulses which are applied to a selected word line during a programming operation.

DETAILED DESCRIPTION

Figure 1:
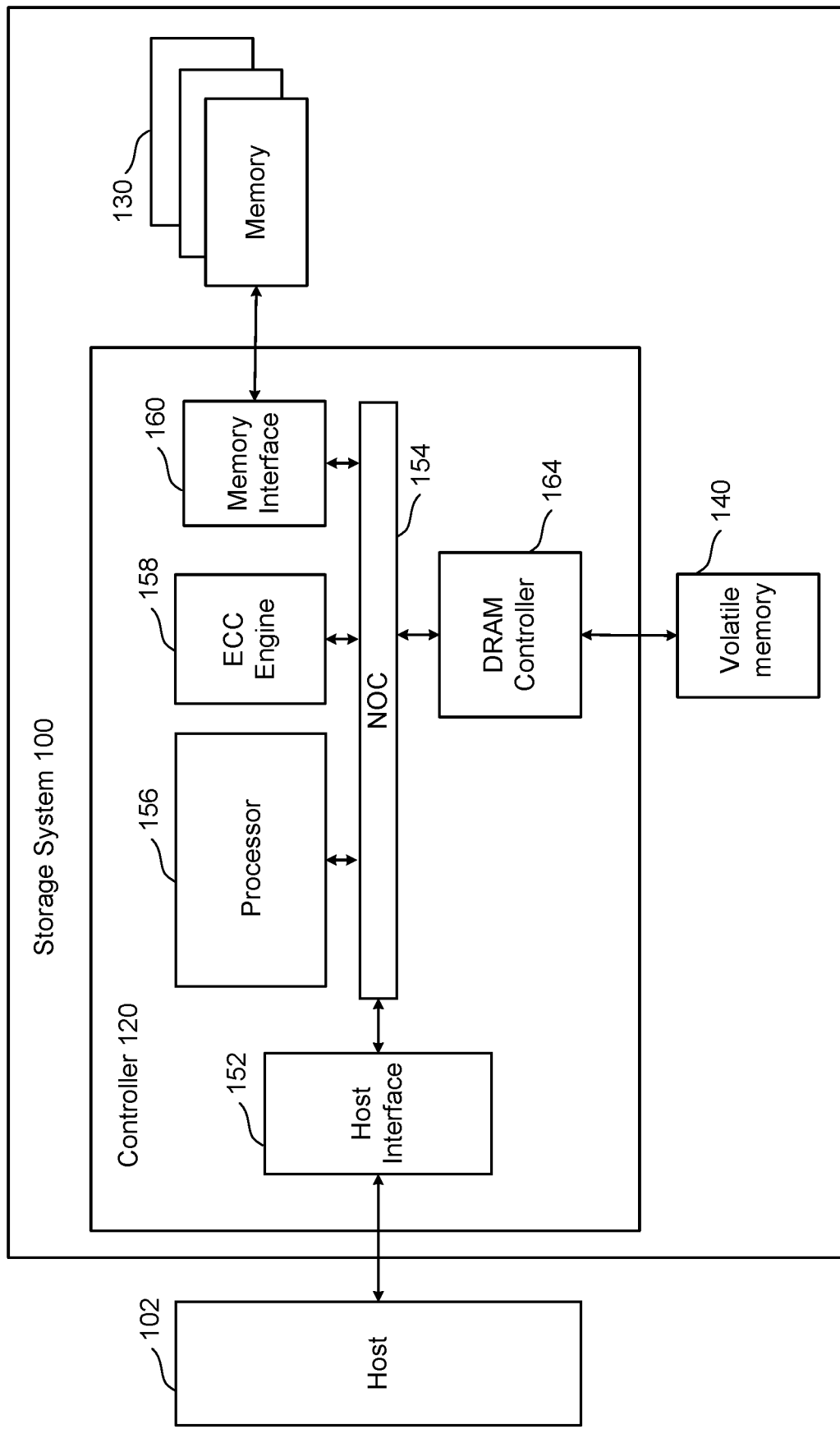
FIG. 1 is a block diagram depicting one embodiment of a memory system.

Technology is described for dynamically pairing or assigning one or more memory array die (e.g., a NAND memory die) that contain memory cells with one or more CMOS die that contain support circuitry (e.g., charge pumps, sense amplifiers, decoders, and state machines) for performing memory operations using the one or more memory array die. To reduce memory system cost and energy consumption, a plurality of stacked die comprising one or more memory array die and one or more support circuitry die may be vertically stacked and connected together via one or more vertical through-silicon via (TSV) connections. The one or more memory array die may comprise one or more memory arrays. In some cases, the one or more memory array die may include column and/or row decoders along with memory cell structures. In other cases, the one or more memory array die may only comprise memory cell structures (e.g., vertical NAND strings) without column decoders, row decoders, charge pumps, sense amplifiers, control circuitry, page registers, and/or state machines. The memory cell structures may include planar NAND structures, vertical NAND structures, Bit Cost Scalable (BiCS) NAND structures, 3D NAND structures, or 3D ReRAM structures. The one or more CMOS die may contain support circuitry for performing various memory operations, such as read, erase, and write memory operations. The support circuitry may include voltage regulators, charge pumps, sense amplifiers, page registers, and state machines. The one or more CMOS die may also include compute cores and/or control circuitry that may be used to perform various computing tasks, such as performing data error detection and correction. The vertical TSV connections may allow reconfigurable electrical connections to span two or more adjacent die within the plurality of stacked die. In one example, the plurality of stacked die may comprise eight die and the vertical TSV connections may comprise a vertical TSV bus that spans all eight die and allows for each of the eight die to electrically connect with one or more of the other seven die. The vertical TSV bus may allow each memory array die of the plurality of stacked die to communicate with or be electrically connected to each CMOS die of the plurality of stacked die.

In some embodiments, a die mapping control circuit or state machine arranged on one of the one or more support circuitry die may determine a mapping between a first memory array die and a first support circuitry die for supporting a memory operation for the first memory array die based on the availability of the first support circuitry die and/or a performance metric for the memory operation. The die mapping control circuit may comprise one or more control circuits that include a state machine and/or combinational logic circuitry. The memory operation may comprise a read operation for reading data from the first memory array die or a programming operation for writing data into memory cells arranged on the first memory array die. The performance metric may comprise a read bandwidth or a programming bandwidth for the memory operation. In one example, in order to satisfy a particular read bandwidth, two or more support circuitry die within a plurality of stacked die may be electrically connected to the first memory array die in order to increase the read throughput. In the case of two support circuitry die being assigned to the first memory array die, the number of memory cells being sensed during a read operation may be increased by two times. In another example, in order to satisfy a particular programming bandwidth, two or more support circuitry die within the plurality of stacked die may be electrically connected to the first memory array die in order to increase the programming throughput. In the case that three support circuitry die are assigned to the first memory array die during a programming operation, the number of memory cells being concurrently programmed during the programming operation may be increased by three times as three times the number of write drivers may be utilized. As the first memory array die may require more read and/or write circuitry in order to meet a read or write performance metric, the die mapping control circuit arranged on one of the plurality of stacked die may increase the number of support circuitry die assigned to the first memory array die. The die mapping control circuit may reallocate the number of support circuitry die assigned to the first memory array die over time based on the real-time availability of the support circuitry die and the real-time performance requirements for memory operations. In one embodiment, the allocation of support circuitry resources may be made dynamically in real-time. In another embodiment, the uneven allocation of support circuitry resources may be made in a manufacturing facility prior to product shipment based on intended use.

In some cases, a die mapping circuit arranged on a first CMOS die of a plurality of stacked die may assign the first CMOS die to a first memory array die at a first point in time and then assign both the first CMOS die and a second CMOS die to the first memory array die at a second point in time subsequent to the first point in time. The die mapping circuit may comprise one or more control circuits. In this case, at the second point in time, in order to satisfy or meet a read or write performance metric, two CMOS die may be required to double the number of sense amplifiers or write circuits used by the first memory array die. In another embodiment, the die mapping circuit arranged on the first CMOS die of the plurality of stacked die may assign a first memory array die to two support circuitry die during a first memory operation for the first memory array die and assign a second memory array die to three support circuitry die during a second memory operation for the second memory array die. The first memory operation for the first memory die and the second memory operation for the second memory array die may be performed concurrently.

Each CMOS die may comprise a memory array support circuitry die that includes voltage regulators, charge pumps, sense amplifiers, page registers, and/or state machines. Each CMOS die may include peripheral I/O circuits to support one or more memory dies, specialized cores to accelerate specific application domains (e.g., ECC, compression, filtering, reconfigurable logic, etc.), and lightweight CPUs to support the general application domain. The peripheral I/O circuits may include sense amplifiers, decoders, charge pumps, etc. The number of CMOS die assigned to a memory array die may depend on the type of memory operation to be performed using the memory array die. For example, if a read operation is to be performed using the memory array die, then four CMOS die may be electrically connected to the memory array die; however, if a programming operation is to be performed using the memory array die, then two CMOS die may be electrically connected to the memory array die.

The number of CMOS die assigned to a memory array die may also depend on the read bandwidth or the write bandwidth required by a memory operation. For example, if a read operation is to be performed using the memory array die and the read bandwidth for the read operation is greater than a threshold bandwidth, then two CMOS die may be electrically connected to the memory array die; however, if the read bandwidth for the read operation is not greater than the threshold bandwidth, then only one CMOS die may be electrically connected to the memory array die.

In some cases, a plurality of stacked die may include a first set of CMOS die and a second set of memory array die. The CMOS die may be physically smaller or have less die area than the memory array die and utilize a less expensive fabrication process than the memory array die. The plurality of stacked die may include a first memory array die arranged on a first layer and two or more different CMOS die arranged on a second layer positioned above the first layer. A second memory array die may then be arranged on a third layer above the second layer. In this case, a combination of horizontal bussing and vertical bussing along with crossbar switch transistors may allow each of the CMOS die within the plurality of stacked die to electrically connect with either the first memory array die or the second memory array die. Vertical and horizontal crossbar structures may be used to allow each of the CMOS die to connect to any of the memory array die within the plurality of stacked die. A vertical connection may be made through a die's substrate using a TSV. In one example, a crossbar structure using one or more TSVs may connect an internal node (e.g., a bit line node) within a first memory array die of the plurality of stacked die with an internal node (e.g., a sense amplifier node) of a second die of the plurality of stacked die.

In one embodiment, a non-volatile storage system may include one or more two-dimensional arrays of non-volatile memory cells. The memory cells within a two-dimensional memory array may form a single layer of memory cells and may be selected via control lines (e.g., word lines and bit lines) in the X and Y directions. In another embodiment, a non-volatile storage system may include one or more monolithic three-dimensional memory arrays in which two or more layers of memory cells may be formed above a single substrate without any intervening substrates. In some cases, a three-dimensional memory array may include one or more vertical columns of memory cells located above and orthogonal to a substrate or substantially orthogonal to the substrate (e.g., within 1-2 degrees of a normal vector that is orthogonal to the substrate). In one example, a non-volatile storage system may include a memory array with vertical bit lines or bit lines that are arranged orthogonal to a semiconductor substrate. The substrate may comprise a silicon substrate.

FIG. 1 is a block diagram of one embodiment of a memory system 100 that implements the proposed technology, including countermeasures for avoiding unrecoverable errors due to over programming. In one embodiment, storage system 100 is a solid state drive ("SSD"). Memory system 100 can also be a memory card, USB drive or other type of storage system. The proposed technology is not limited to any one type of memory system. Memory system 100 is connected to host 102, which can be a computer, server, electronic device (e.g., smart phone, tablet or other mobile device), appliance, or another apparatus that uses memory and has data processing capabilities. In some embodiments, host 102 is separate from, but connected to, memory system 100. In other embodiments, memory system 100 is embedded within host 102.

The components of memory system 100 depicted in FIG. 1 are electrical circuits. Memory system 100 includes a controller 120 connected to one or more memory die 130 and local high speed volatile memory 140 (e.g., DRAM). The one or more memory die 130 each comprise a plurality of non-volatile memory cells. More information about the structure of each memory die 130 is provided below. Local high speed volatile memory 140 is used by controller 120 to perform certain functions. For example, local high speed volatile memory 140 stores logical to physical address translation tables ("L2P tables").

Controller 120 comprises a host interface 152 that is connected to and in communication with host 102. In one embodiment, host interface 152 provides a PCIe interface. Other interfaces can also be used, such as SCSI, SATA, etc. Host interface 152 is also connected to a network-on-chip (NOC) 154. A NOC is a communication subsystem on an integrated circuit. NOC's can span synchronous and asynchronous clock domains or use un-clocked asynchronous logic. NOC technology applies networking theory and methods to on-chip communications and brings notable improvements over conventional bus and crossbar interconnections. NOC improves the scalability of systems on a chip (SoC) and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). In other embodiments, NOC 154 can be replaced by a bus. Connected to and in communication with NOC 154 is processor 156, ECC engine 158, memory interface 160, and DRAM controller 164. DRAM controller 164 is used to operate and communicate with local high speed volatile memory 140 (e.g., DRAM). In other embodiments, local high speed volatile memory 140 can be SRAM or another type of volatile memory.

ECC engine 158 performs error correction services. For example, ECC engine 158 performs data encoding and decoding, as per the implemented ECC technique. In one embodiment, ECC engine 158 is an electrical circuit programmed by software. For example, ECC engine 158 can be a processor that can be programmed. In other embodiments, ECC engine 158 is a custom and dedicated hardware circuit without any software. In another embodiment, the function of ECC engine 158 is implemented by processor 156.

Processor 156 performs the various controller memory operations, such as programming, erasing, reading, as well as memory management processes. In one embodiment, processor 156 is programmed by firmware. In other embodiments, processor 156 is a custom and dedicated hardware circuit without any software. Processor 156 also implements a translation module, as a software/firmware process or as a dedicated hardware circuit. In many systems, the non-volatile memory is addressed internally to the storage system using physical addresses associated with the one or more memory die. However, the host system may use logical addresses to address the various memory locations. This enables the host to assign data to consecutive logical addresses, while the storage system is free to store the data as it wishes among the locations of the one or more memory die. To implement this system, the controller (e.g., the translation module) performs address translation between the logical addresses used by the host and the physical addresses used by the memory dies. One example implementation is to maintain tables (i.e. the L2P tables mentioned above) that identify the current translation between logical addresses and physical addresses. An entry in the L2P table may include an identification of a logical address and corresponding physical address. Although logical address to physical address tables (or L2P tables) include the word "tables" they need not literally be tables. Rather, the logical address to physical address tables (or L2P tables) can be any type of data structure. In some examples, the memory space of a storage system is so large that the local memory 140 cannot hold all of the L2P tables. In such a case, the entire set of L2P tables are stored in a memory die 130 and a subset of the L2P tables are cached (L2P cache) in the local high speed volatile memory 140.

Memory interface 160 communicates with one or more memory die 130. In one embodiment, memory interface provides a Toggle Mode interface. Other interfaces can also be used. In some example implementations, memory interface 160 (or another portion of controller 120) implements a scheduler and buffer for transmitting data to and receiving data from one or more memory die.

Figure 2A:
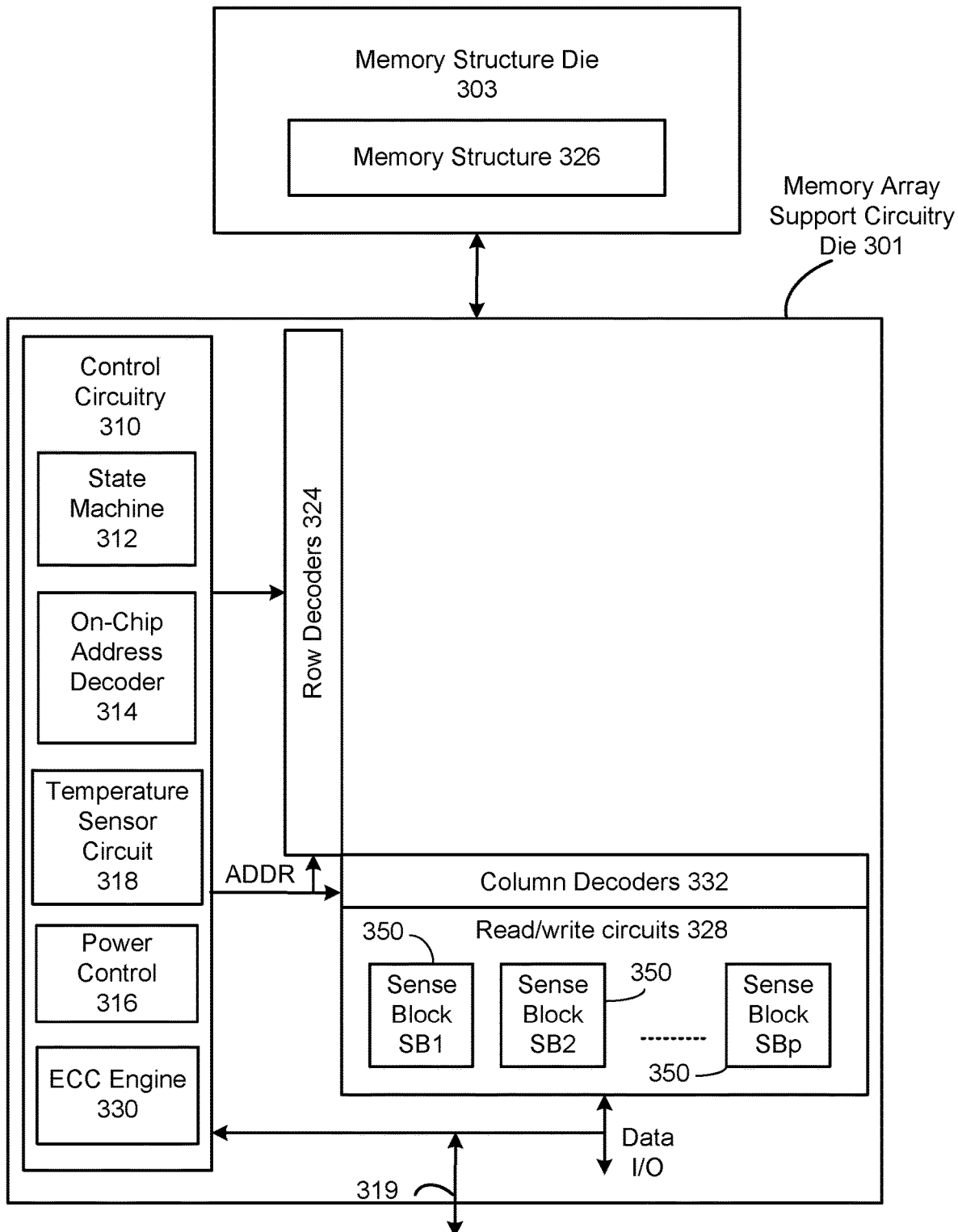
FIG. 2A depicts one embodiment of two separate die.

FIG. 2A depicts one embodiment in which elements of a memory system are grouped into two separate die comprising the memory structure die 303 (e.g., a die with only the memory array structures) and the memory array support circuitry die 301 (e.g., a die comprising the control circuits that facilitate memory operations for the memory structure 326). In some cases, the memory structure die 303 and the memory array support circuitry die 301 may be bonded together or arranged as a vertical stack of die within an integrated memory assembly. The memory structure die 303 may include non-volatile memory cells and the word lines and bit lines for accessing the non-volatile memory cells. The arrangement of the control circuits for performing memory operations (e.g., read and write operations) using the memory structure 326 on the memory array support circuitry die 301 allows the control circuits (e.g., row decoders, column decoders, and read/write circuits) to be fabricated using a different process technology compared with the process technology used for fabricating the memory structure die 303. Thus, the memory structure die 303 may be optimized for the memory array structure without worrying about the CMOS elements or control circuitry.

In some cases, the memory structure 326 can be formed on one die, such as the memory structure die 303, and some or all of the peripheral circuitry elements, including one or more control circuits, can be formed on a separate die, such as the memory array support circuitry die 301. In one example, the memory structure die 303 can be formed of just a memory array of memory elements, such as an array of memory cells of flash NAND memory, PCM memory, or ReRAM memory. In some cases, each of the one or more memory die 130 of FIG. 1 may correspond with the memory structure die 303 of FIG. 2A.

In reference to FIG. 2A, the word lines within the memory structure 326 may be biased by the row decoders 324 within the memory array support circuitry die 301 and the bit lines within the memory structure 326 may be biased by the column decoders 332 within the memory array support circuitry die 301. The read/write circuits 328 include multiple sense blocks 350 including SB1, SB2, . . . , SBp (sensing circuitry) and allow a page (or multiple pages) of data in multiple memory cells to be read or programmed (written) in parallel. In one embodiment, each sense block includes a sense amplifier and a set of latches. The latches store data to be written and/or data that has been read. Commands and data may be transferred between a controller, such as controller 120 in FIG. 1, and the memory array support circuitry die 301 via lines 319.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316, a temperature sensor circuit 318, and an ECC engine 330. The ECC engine 330 may generate ECC codes for protecting data to be stored within the memory structure 326. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a programmable microcontroller or microprocessor. In one embodiment, control circuitry 310 includes buffers such as registers, ROM fuses and other storage devices for storing default values such as base voltages and other parameters. Temperature sensor circuit 318 detects a die temperature for the memory array support circuitry die 301.

In some embodiments, one or more of the components (alone or in combination) within the memory array support circuitry die 301 may be referred to as a managing or control circuit. For example, one or more managing or control circuits may include any one of or a combination of control circuitry 310, state machine 312, decoder 314, power control 316, sense blocks 350, or read/write circuits 328. The one or more managing circuits or the one or more control circuits may perform or facilitate one or more memory array operations including erasing, programming, or reading operations.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 may be arranged in vertical NAND strings. In another embodiment, memory structure 326 comprises a two dimensional memory array of non-volatile memory cells. In one example, the non-volatile memory cells are NAND flash memory cells utilizing floating gates.

The exact type of memory array architecture or memory cell included in memory structure 326 is not limited to the examples above. Many different types of memory array architectures or memory cell technologies can be used to form memory structure 326. Other examples of suitable technologies for memory cells of the memory structure 326 include ferroelectric memories (FeRAM or FeFET), ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 326 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a Ge2Sb2Te5 alloy to achieve phase changes by electrically heating the phase change material. The doses of programming are electrical pulses of different amplitude and/or length resulting in different resistance values of the phase change material.

A person of ordinary skill in the art will recognize that the technology described herein is not limited to a single specific memory structure, but covers many relevant memory structures within the spirit and scope of the technology as described herein and as understood by one of ordinary skill in the art.

Figure 2B:
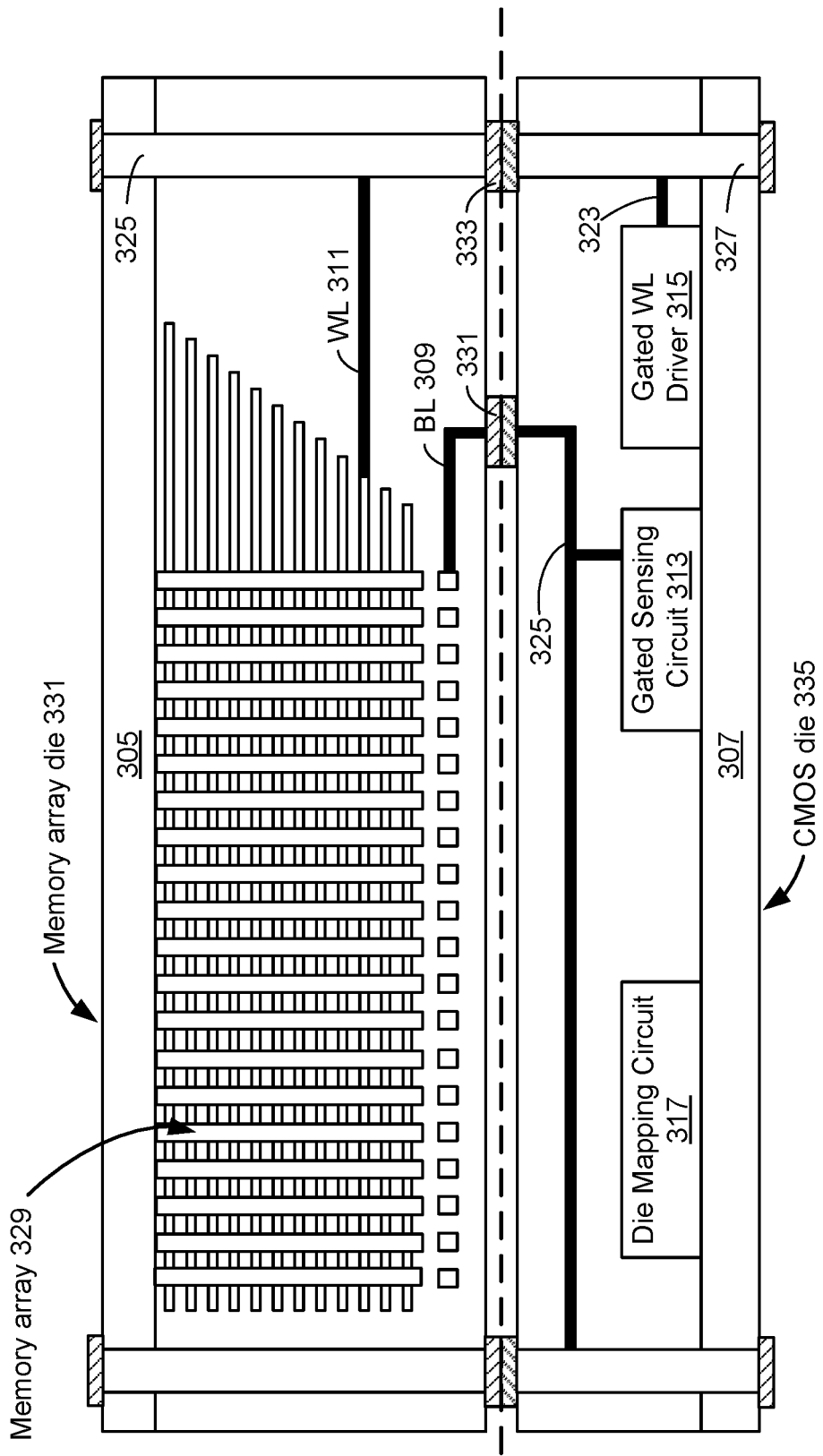
FIG. 2B depicts one embodiment of a plurality of stacked die that includes a memory array die and a CMOS die.

FIG. 2B depicts one embodiment of a plurality of stacked die that includes memory array die 331 and CMOS die 335. The memory array die 331 may correspond with the memory structure die 303 in FIG. 2A. The CMOS die 335 may correspond with the memory array support circuitry die 301 in FIG. 2A. As depicted in FIG. 2B, the memory array die 331 has been positioned above and bonded to the CMOS die 335. The memory array die 331 includes a memory array 329 comprising a plurality of memory cells. In one example, the memory array 329 may comprise a plurality of vertical NAND strings. The CMOS die 335 also includes a die mapping circuit 317 for mapping or electrically connecting one or more CMOS die within the plurality of stacked die with one or more memory array die within the plurality of stacked die. The die mapping circuit 317 may cause the gated sensing circuit 313 to be electrically connected to the bit line connection 325 or to be electrically disconnected from the bit line connection 325. The die mapping circuit 317 may cause the gated word line WL driver 315 to be electrically connected to the word line connection 323 or to be electrically disconnected from or cut off from the word line connection 323.

The CMOS die 335 also includes gated sensing circuit 313 and gated word line WL driver 315. The gated sensing circuit 313 may comprise a set of sense amplifiers (or a set of read/write circuits such as read/write circuits 328 in FIG. 2A) in series with an analog multiplexor or other gating transistors that may cut off the gated sensing circuit 313 from the bit line connection 325. As the bit line connection 325 has been connected to the bit line BL 309 of the memory array die 301 via bond pad 331, if the set of sense amplifiers within the gated sensing circuit 313 is electrically connected to the bit line connection 325, then the set of sense amplifiers may bias the bit line BL 309 connected to the memory array 329 and sense current from memory cells within the memory array 329. However, if sense amplifiers from another CMOS die not depicted are instead electrically connected to the bit line connection 325, then the gated sensing circuit 313 will prevent the set of sense amplifiers from being electrically connected to the bit line connection 325.

The gated word line WL driver 315 may comprise a set of word line drivers (or last stage row decoders) in series with an analog multiplexor or other gating transistors that may cut off or electrically disconnect the gated word line WL driver 315 from the word line connection 323. As the word line connection 323 has been connected to the word line WL 311 of the memory array 329, if the set of word line drivers within the gated word line WL driver 315 is electrically connected to the word line connection 323, then the set of word line drivers may drive or bias the word line WL 311 connected to the memory array 329. However, if word line drivers from another CMOS die not depicted are instead electrically connected to the word line WL 311 connected to the memory array 329, then the gated word line WL driver 315 will prevent the set of word line drivers within the gated word line WL driver 315 from being electrically connected to the word line connection 323. Both the word line connection 323 and the word line WL 311 connected to the memory array 329 are electrically connected to a portion of a vertical TSV bus that includes a first TSV 325 that extends through a substrate 305 of the memory array die 331 and a second TSV 327 that extends through a substrate 307 of the CMOS die 335. The portion of the vertical TSV bus may allow other die not depicted arranged above or below the memory array die 331 to electrically connect to the word line WL 311.

Figure 3A:
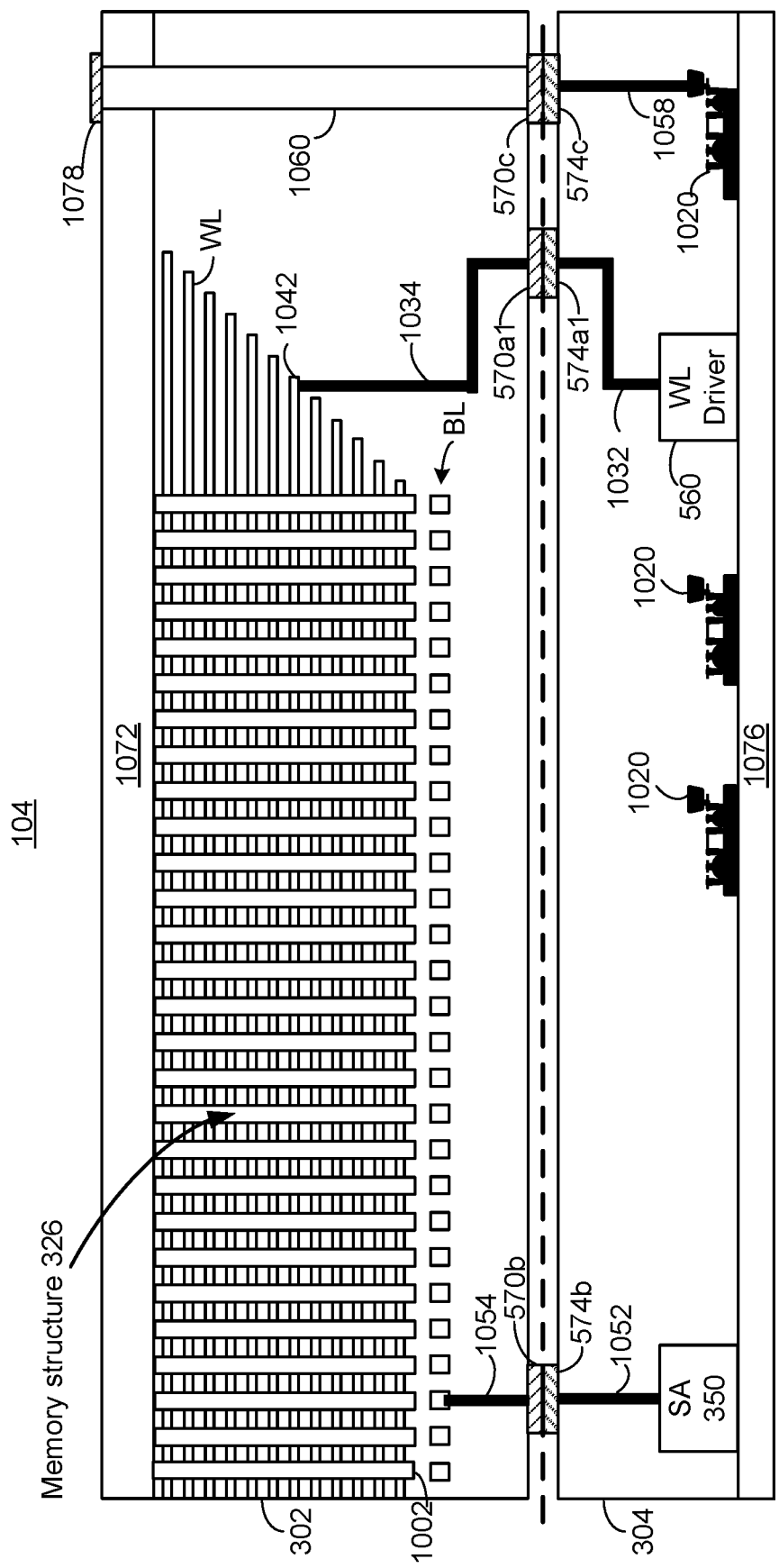
FIGS. 3A-3B depict various embodiments of an integrated memory assembly.

FIG. 3A depicts one embodiment of an integrated memory assembly 104. As depicted, the memory die 302 is bonded to control die 304. Note that although a gap is depicted between the pair of adjacent die, such a gap may be filled with an epoxy or other resin or polymer. The memory die 302 includes a memory structure 326. Memory structure 326 may be fabricated on substrate 1072 of memory die 302. The substrate 1072 may be formed from a portion of a silicon wafer, in some embodiments. The memory structure 326 may comprise a three-dimensional memory array or an array of vertical NAND strings. As depicted, the memory structure 326 may include a number of word line (WL) layers and bit line (BL) layers. The word line layers may be separated by dielectric layers. The dielectric layers are represented by gaps between the word line layers. There are a number of columns that extend through the stack of word line layers. One column 1002 is referred to in each stack with reference numeral 1002. The columns contain memory cells. For example, each column may contain a NAND string. There are a number of bit lines (BL) adjacent to the stack.

Word line driver 560 concurrently provides voltages to a word line 1042 in memory die 302. The conductive pathway from the word line driver 560 to the word line 1042 includes conductive pathway 1032, bond pad 574a1, bond pad 570a1, and conductive pathway 1034. In some embodiments, conductive pathways 1032, 1034 are referred to as a pathway pair. Conductive pathways 1032, 1034 may each include one or more vias (which may extend vertically with respect to the major surfaces of the die) and one or more metal interconnects (which may extend horizontally with respect to the major surfaces of the die). Conductive pathways 1032, 1034 may include transistors or other circuit elements. In one embodiment, the transistors may be used to, in effect, open or close the pathway. Other word line drivers (not depicted in FIG. 3A) provide voltages to other word lines. Thus, there are additional bond pad 574a, 570a in addition to bond pads 574a1, 570a1. The bond pads may be formed for example of copper, aluminum and alloys thereof.

Sense amplifier 350 is in communication with a bit line in memory die 302. The pathway from the sense amplifier 350 to the bit line includes conductive pathway 1052, bond pad 574b, bond pad 570b, and conductive pathway 1054. In some embodiments, conductive pathways 1052, 1054 are referred to as a pathway pair. Conductive pathways 1052, 1054 may include one or more vias (which may extend vertically with respect to the major surfaces of the die) and one or more metal interconnects (which may extend horizontally with respect to the major surfaces of the die). The metal interconnects may be formed of a variety of electrically conductive metals including aluminum, tungsten, and copper and the vias may be lined and/or filled with a variety of electrically conductive metals including tungsten, copper and copper alloys. Conductive pathways 1052, 1054 may include transistors or other circuit elements. In one embodiment, the transistors may be used to, in effect, open or close the pathway.

The control die 304 has a substrate 1076, which may be formed from a silicon wafer. The sense amplifiers 350, word line driver(s) 560, and other circuitry 1020 may be formed on and/or in the substrate 1076. The circuitry 1020 may include some or all of the control circuitry 310 depicted in FIG. 2A. In some embodiments, sense amplifiers 350, word line driver(s) 560, and/or other circuitry 1020 comprise CMOS circuits.

There may be an external signal path that allows circuitry on the control die 304 to communicate with an entity external to the integrated memory assembly 104, such as memory controller 102 in FIG. 1. Therefore, circuitry 1020 on the control die 304 may communicate with controller 102. The external pathway includes via 1058 in control die 304, bond pad 574c, bond pad 570c, through silicon via (TSV) 1060, and external pad 1078. The TSV 1060 extends through substrate 1072. The TSV 1060, may be formed before, during or after formation of the integrated circuits in the semiconductor die 302, 304. The TSV may be formed by etching holes through the wafers. For example, holes may be etched through substrate 1072.

Figure 3B:
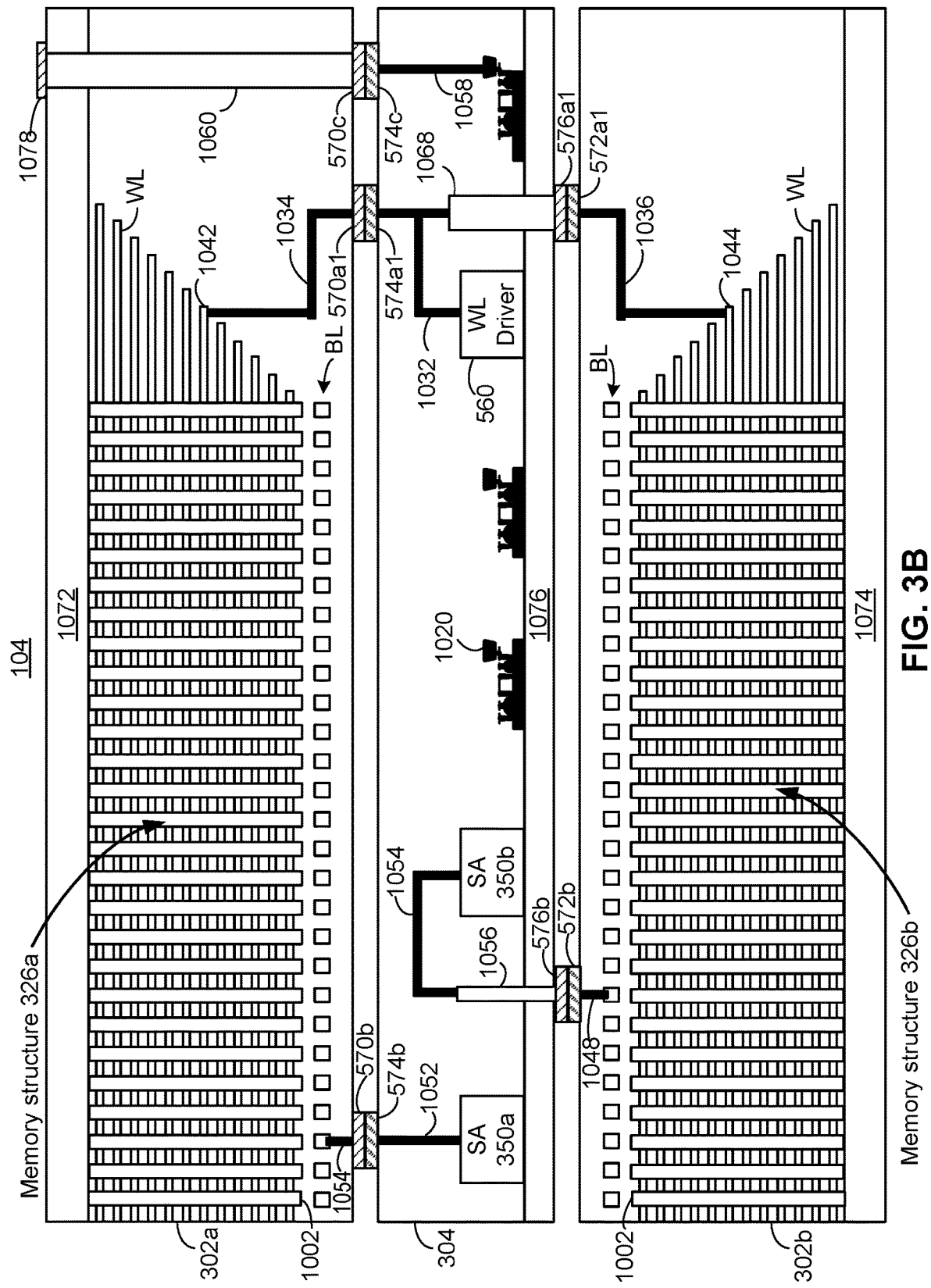

FIG. 3B depicts another embodiment of an integrated memory assembly 104. The configuration in FIG. 3B adds an extra memory die relative to the configuration depicted in FIG. 3A. Hence, similar reference numerals are used for memory die 302a in FIG. 3B as were used for memory die 302 in FIG. 3A. In one embodiment, first memory die 302a is bonded to control die 304, and control die 304 is bonded to second memory die 302b. Note that although a gap is depicted between the pairs of adjacent die, such a gap may be filled with an epoxy or other resin or polymer.

Each memory die 302a, 302b includes a memory structure 326. Memory structure 326a is adjacent to substrate 1072 of memory die 302a. Memory structure 326b is adjacent to substrate 1074 of memory die 302b. The substrates 1072, 1074 are formed from a portion of a silicon wafer, in some embodiments. In this example, the memory structures 326 each include a three-dimensional memory array.

Word line driver 560 concurrently provides voltages to a first word line 1042 in memory die 302a and a second word line 1044 in memory die 302b. The pathway from the word line driver 560 to the second word line 1044 includes conductive pathway 1032, through silicon via (TSV) 1068, bond pad 576a1, bond pad 572a1, and conductive pathway 1036. Other word line drivers (not depicted in FIG. 3B) provide voltages to other word lines.

Sense amplifier 350a is in communication with a bit line in memory die 302a. The pathway from the sense amplifier 350a to the bit line includes conductive pathway 1052, bond pad 574b, bond pad 570b, and conductive pathway 1054. Sense amplifier 350b is in communication with a bit line in memory die 302b. The pathway from the sense amplifier 350b to the bit line includes conductive pathway 1054, TSV 1056, bond pad 576b, bond pad 572b, and conductive pathway 1048. Numerous modification to an embodiment depicted in FIG. 3B are possible One modification is for sense amplifiers 350a to be located on first memory die 302a, and for sense amplifiers 350b to be located on second memory die 302b.

Figure 4:
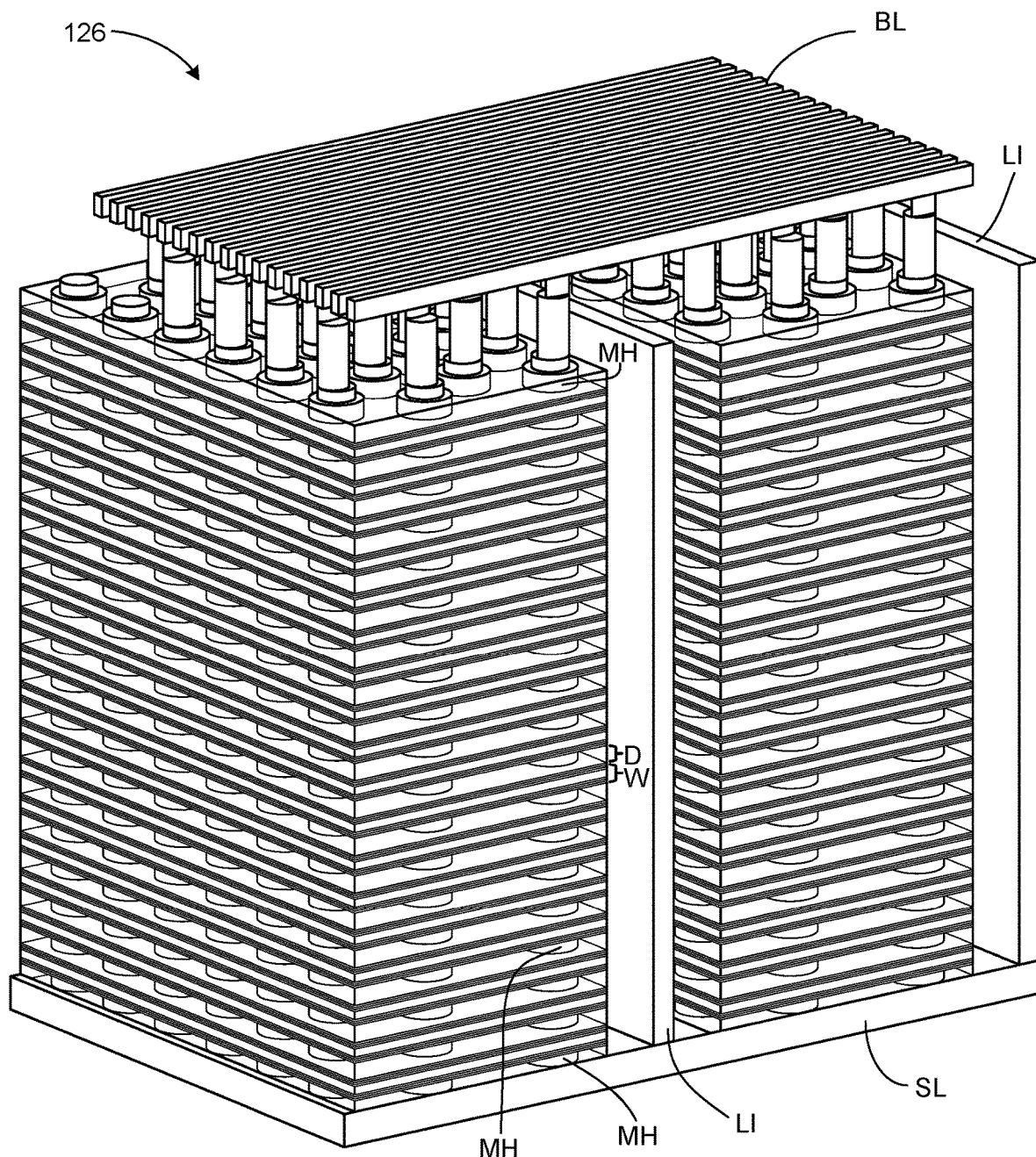
FIG. 4 is a perspective view of a portion of one embodiment of a monolithic three dimensional memory structure.

FIG. 4 is a perspective view of a portion of one example embodiment of a monolithic three dimensional memory array that can comprise memory structure 326, which includes a plurality non-volatile memory cells arranged as vertical NAND strings. For example, FIG. 4 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-300 alternating dielectric layers and conductive layers. One example embodiment includes 96 data word line layers, 8 select layers, 6 dummy word line layers and 110 dielectric layers. More or less than 108-300 layers can also be used. As will be explained below, the alternating dielectric layers and conductive layers are divided into four "fingers" by local interconnects LI. FIG. 4 shows two fingers and two local interconnects LI. Below the alternating dielectric layers and word line layers is a source line layer SL. Memory holes are formed in the stack of alternating dielectric layers and conductive layers. For example, one of the memory holes is marked as MH. Note that in FIG. 4, the dielectric layers are depicted as see-through so that the reader can see the memory holes positioned in the stack of alternating dielectric layers and conductive layers. In one embodiment, NAND strings are formed by filling the memory hole with materials including a charge-trapping material to create a vertical column of memory cells. Each memory cell can store one or more bits of data.

The memory systems discussed herein can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 is a graph of threshold voltage versus number of memory cells, and illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. For a data state N, that data state N has higher threshold voltages than data state N−1 and lower threshold voltages than data state N+1. The first threshold voltage distribution (data state) S0 represents memory cells that are erased. The other seven threshold voltage distributions (data states) S1-S7 represent memory cells that are programmed and, therefore, are also called programmed states or programmed data states. In some embodiments, data states S1-S7 can overlap, with controller 122 relying on error correction to identify the correct data being stored.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7 (also referred to as verify target voltages). When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4.

When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming including (but not limited to) multiple stage/phase programming.

Each threshold voltage distribution (data state) of FIG. 5 corresponds to predetermined values for the set of data bits stored in the memory cells. The specific relationship between the data programmed into the memory cell and the threshold voltage levels of the memory cell depends upon the data encoding scheme adopted for the memory cells. In one embodiment, data values are assigned to the threshold voltage ranges using a Gray code assignment so that if the threshold voltage of a memory erroneously shifts to its neighboring physical state, only one bit will be affected.

FIG. 6A is a table describing one example of an assignment of data values to data states. In the table of FIG. 6A, S0=111 (erased state), S1=110, S2=100, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state.

In general, during verify operations and read operations, the selected word line is connected to a voltage (one example of a reference signal), a level of which is specified for each read operation (e.g., see read reference voltages Vr1, Vr2, Vr3, Vr4, Vr5, Vr6, and Vr7, of FIG. 5) or verify operation (e.g. see verify reference voltages Vv1, Vv2, Vv3, Vv4, Vv5, Vv6, and Vv7 of FIG. 5) in order to determine whether a threshold voltage of the concerned memory cell has reached such level. After applying the word line voltage, the conduction current of the memory cell is measured to determine whether the memory cell turned on (conducted current) in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell. During a read or verify process, the unselected memory cells are provided with one or more read pass voltages (also referred to as bypass voltages) at their control gates so that these memory cells will operate as pass gates (e.g., conducting current regardless of whether they are programmed or erased).

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that includes the memory cell to discharge a corresponding bit line. The voltage on the bit line is measured after a period of time to see whether it has been discharged or not. Note that the technology described herein can be used with different methods known in the art for verifying/reading. Other read and verify techniques known in the art can also be used.

As discussed above, it is possible that memory cells can become over programmed. For example, consider the example of a memory cell intended to be programmed to data state S4. The programming process is designed to increase the threshold voltage of the memory cell from the threshold voltage distribution for data state S0 to data S4 by applying a programming signal as a set of programming pulses that increase in magnitude by a step size and testing between program pulses as to whether the memory cell's threshold voltage has reached Vv4. However, due to a structural variation or increase in programming speed due to program/erase cycling, it is possible that when the memory cell's threshold voltage has reached Vv4 it has also surpassed Vr5, which may lead to an error when reading the memory cell later. This is one example of over programming. If a small number of memory cells become over programmed, the ECC process during reading may be able to correct the errors. However, if too many memory cells are over programmed or have errors, then the ECC may not be able to correct all of the errors and the reading process may fail, resulting in loss of data.

To prevent loss of data, it is proposed that the non-volatile storage system include a mechanism to compensate for over programming during the programming process. That is, after the programming process starts for a set of data and target memory cells and prior to the programming process completing for the set of data and the target memory cells, the system determines whether there is more than a threshold number of over programmed memory cells and, if so, then the system adjusts the programming process mid-way through the programming process (e.g., in-flight) to compensate for the over programming that has occurred so far in the currently being performed programming process.

FIG. 6B depicts one embodiment of a series of program and verify pulses which are applied to a selected word line during a programming operation. A programming operation may include multiple program-verify iterations, where each iteration applies one or more programming pulses followed by one or more verify pulses (e.g., to verify or determine the programming state or the programming level of a memory cell) to a selected word line. In one embodiment, the programming pulses are stepped up in successive iterations. Moreover, each programming pulse may include a first portion which has a pass voltage (Vpass) level, e.g., 6-8 V, followed by a second, highest amplitude portion at a programming voltage (Vpgm) level, e.g., 12-25 V. For example, as depicted in FIG. 6B, a first, second, third, and fourth programming pulses 800, 802, 804 and 806 have programming voltage levels of Vpgm1, Vpgm2, Vpgm3 and Vpgm4, respectively. One or more verify voltages 808, such as verify voltages Vva, Vvb and Vvc, may be provided after each programming pulse. In some cases, one or more initial programming pulses are not followed by verify pulses because it is not expected that any storage elements could have reached the lowest program state (e.g., A-state). Subsequently, in some cases, programming iterations may use verify pulses for the A-state, followed by programming iterations which use verify pulses for the A-states and B-states, followed by programming iterations which use verify pulses for the B-states and C-states.

Figure 7A:
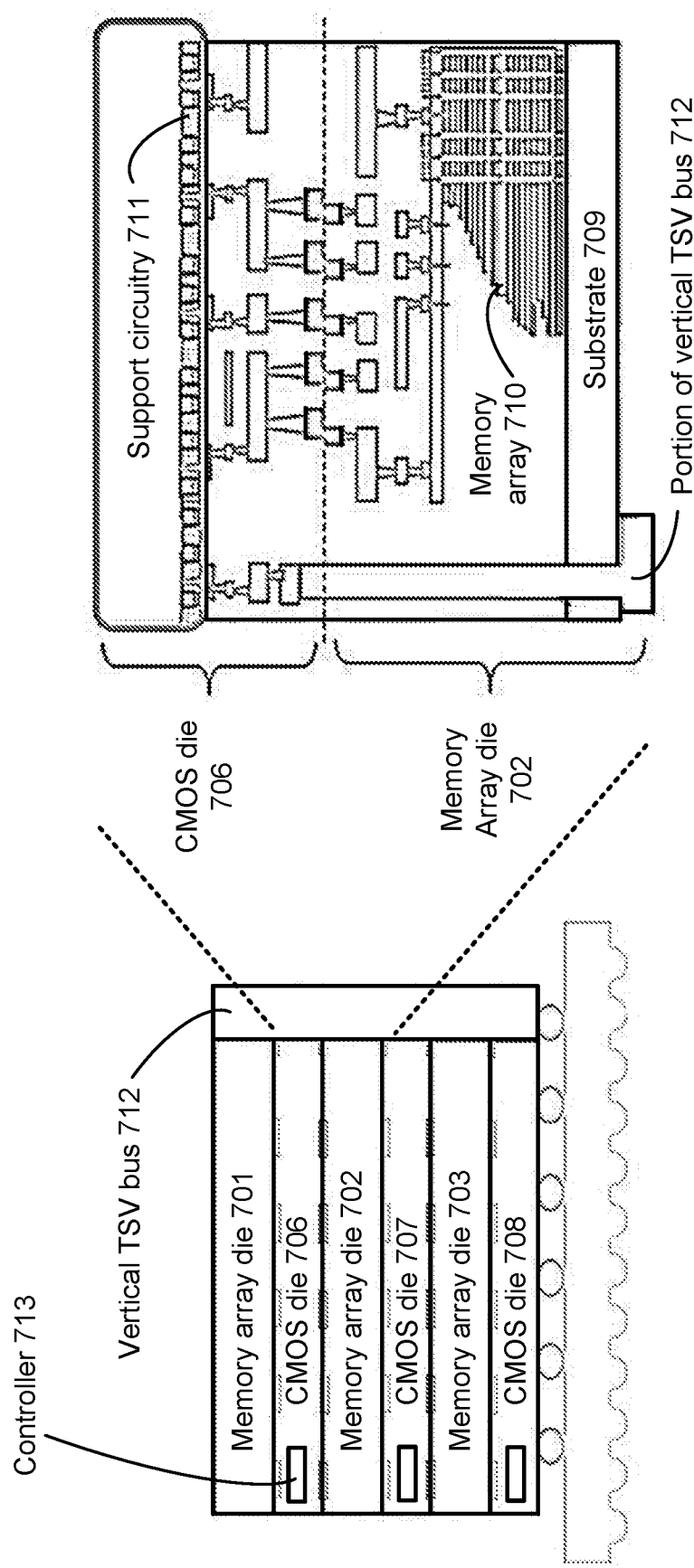
FIG. 7A depicts one embodiment of a plurality of stacked die.

FIG. 7A depicts one embodiment of a plurality of stacked die. As depicted, the plurality of stacked die includes memory array die 701-703 and CMOS die 706-708 interdigitated in a vertical stack. The CMOS die 706-708 may include CMOS circuitry for controlling various memory operations performed using the memory array die 701-703. The CMOS die 706 includes a controller 713, which may comprise a die mapping controller for assigning one or more CMOS die within the plurality of stacked die to one or more of the memory array die within the plurality of stacked die. In one example, the controller 713 may correspond with die mapping circuit 317 in FIG. 2B. Each die of the plurality of stacked die may be in communication with the other die of the plurality of stacked die via a vertical TSV bus 712. The vertical TSV bus 712 may comprise configurable electrical connections that span the length of the stacked die and may include through-silicon vias through each of the memory array die 701-703. The configurable electrical connections may utilize a crossbar structure or transistor-based multiplexors.

The CMOS die 706 may be flipped such that its substrate is positioned above the interconnect layers for the CMOS die 706 and then positioned above and connected to the memory array die 702. Some of the memory array die and CMOS die may utilize a flip chip pairing with the active elements of the support circuitry 711 positioned above the interconnections for the CMOS die 706 and the memory array 710 (e.g., comprising vertical NAND strings) positioned above the substrate 709 for the memory array die 702. An electrical connection comprising a portion of the vertical TSV bus 712 may extend from the CMOS die 706 through the substrate 709 of the memory array die 702 using a TSV. The portion of the vertical TSV bus 712 may connect to support circuitry for the CMOS die 707, which may then extend from the CMOS die 707 through the substrate of the memory array die 703 using another TSV. Although the vertical TSV bus 712 is depicted as extending along one side of the plurality of stacked die, other vertical TSV busses or electrical connections may extend through a middle portion of the stacked die.

Figure 7B:
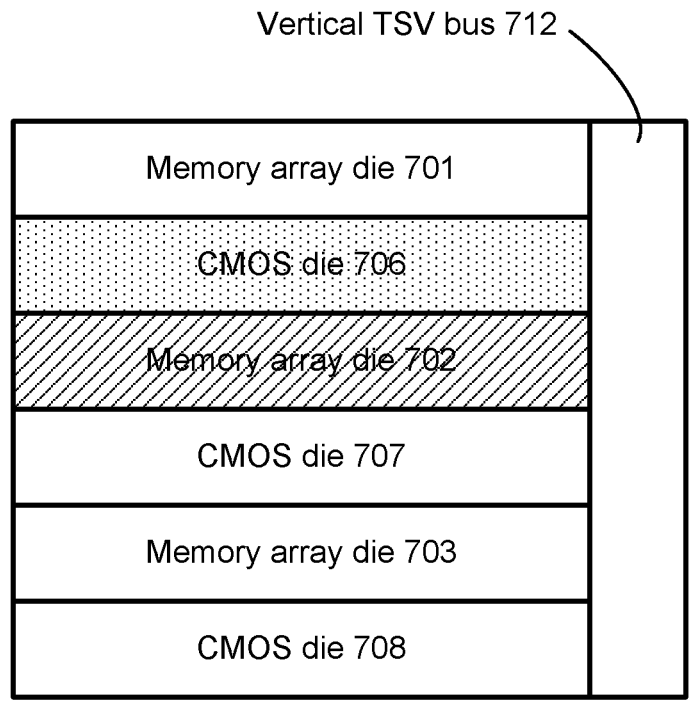
FIG. 7B depicts one embodiment of the plurality of stacked die depicted in FIG. 7A in which a memory operation is being performed.

FIG. 7B depicts one embodiment of the plurality of stacked die depicted in FIG. 7A in which a memory operation is being performed. The memory operation may comprise a read operation, a program verify operation, or a programming operation. In this case, a one-to-one pairing between the memory array die 702 and the CMOS die 706 has been made. In one example, the CMOS die 706 may include 1024 sense amplifiers that are electrically connected to column decoders arranged on the memory array die 702; in this case, the memory array die 702 may include a memory array (e.g., comprising a 3D BiCS structure) along with row decoders for selecting word lines of the memory array and column decoders for selecting bit lines of the memory array. In some cases, the memory array die 702 may not include any support circuitry except for the last stage row decoders and the last stage column. In another example, the CMOS die 706 may include memory array support circuitry that directly connects to bit lines within the memory array die 702. The electrical connections from the CMOS die 706 to the memory array die 702 may be configured or made using the vertical TSV bus 712. In some embodiments, additional circuitry arranged on each die of the plurality of stacked die may provide for a crossbar structure or selector network in which a sense amplifier node of the CMOS die 706 may electrically connect to a column decoder node of one of the memory array die 701-703.

In some embodiments, the memory array die 702 may provide an "in-memory-computing" system that performs logical operations (e.g., AND, XOR, etc.) via modification of the word line driver circuits and/or sense amplifier circuits. In this case, instead of storing user data within memory cells of the memory array die 702, memory cell transistors within the memory array die 702 may be configured along with the word line driver circuits and/or sense amplifier circuits to perform the logical operations.

Figure 7C:
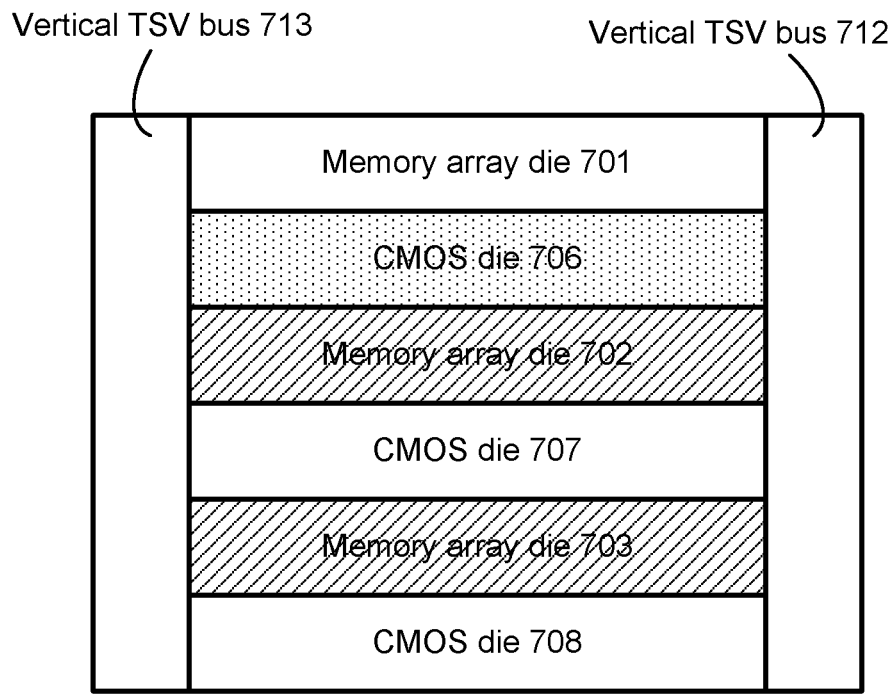
FIG. 7C depicts one embodiment of the plurality of stacked die depicted in FIG. 7A in which a second vertical TSV bus is utilized during memory operations for memory array die.

FIG. 7C depicts one embodiment of the plurality of stacked die depicted in FIG. 7A in which a second vertical TSV bus 713 is utilized during memory operations for memory array die 702-703. In one example, CMOS die 706 may be paired with memory array die 702 during a read operation using the vertical TSV bus 712 and then CMOS die 706 may be paired with memory array die 703 during a write operation using the vertical TSV bus 713. In this case, the vertical TSV bus 713 may connect write drivers or programming circuitry to control lines within the memory array die 703 and vertical TSV bus 712 may connect sense amplifiers or reading circuitry to control lines within the memory array die 702. Therefore, memory array support circuitry located on CMOS die 706 may be time shared by the memory array die 702-703. In situations in which read or write performance may be relaxed or the other CMOS die within the plurality of stacked die are unavailable, the CMOS die 706 may be time shared by two or more of the memory array die within the plurality of stacked die.

Figure 7D:
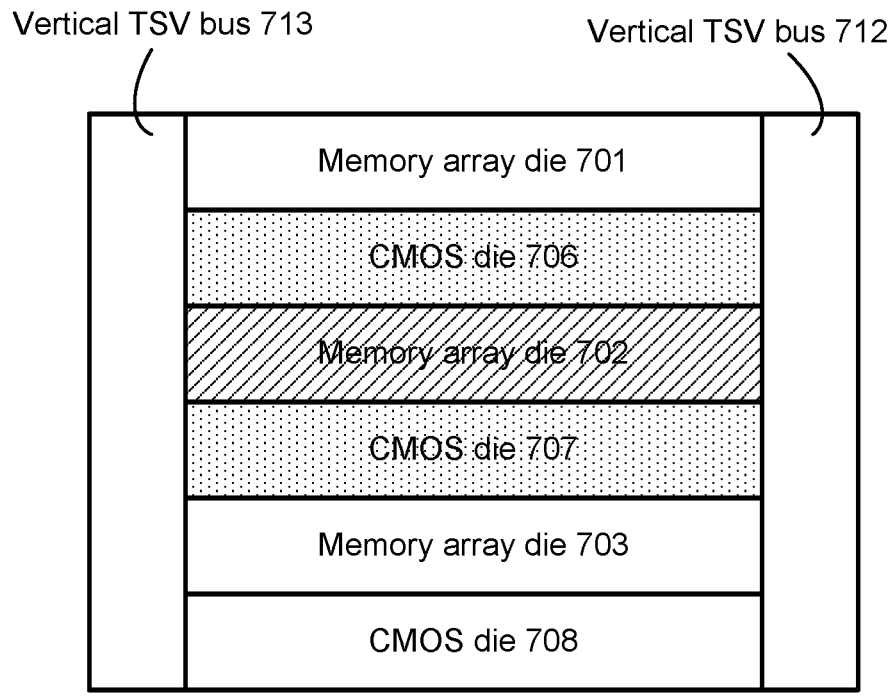
FIG. 7D depicts one embodiment of the plurality of stacked die depicted in FIG. 7A in which a memory operation is being performed using a memory array die.

FIG. 7D depicts one embodiment of the plurality of stacked die depicted in FIG. 7A in which a memory operation is being performed using a memory array die 702. As depicted, both CMOS die 706 and CMOS die 707 have been electrically connected to the memory array die 702 during the memory operation. The memory operation may comprise a read operation, a program verify operation, an erase operation, or a programming operation. The CMOS die 706 may be electrically connected to the memory array die 702 via the vertical TSV bus 712 and the CMOS die 707 may be electrically connected to the memory array die 702 via the vertical TSV bus 713. In this case, the read or write performance of the memory operation may be increased by utilizing two different CMOS die during the memory operation. In order to increase read performance, the number of CMOS die electrically connected to the memory array die 702, and therefore the number of sense amplifiers used for determining data states of memory cells within the memory array die 702, may be increased. The determination of the number of CMOS die to assign to the memory array die 702 during the memory operation may be made by a mapping circuit or controller arranged on one of the CMOS die 706-708.

Figure 7E:
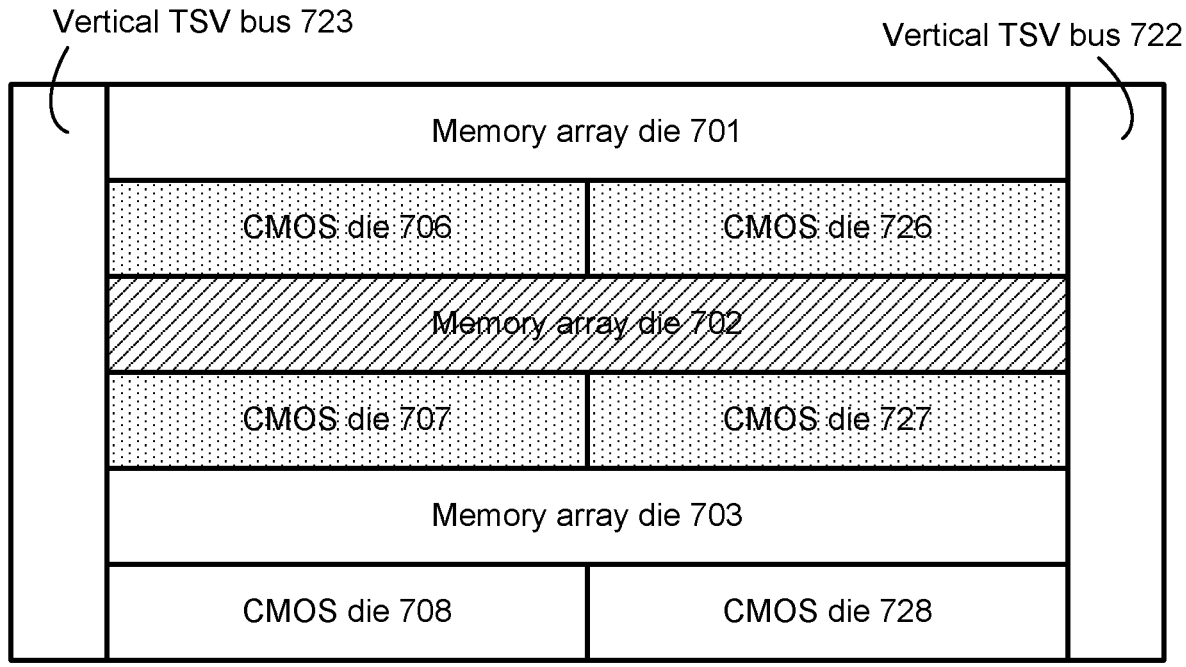
FIG. 7E depicts one embodiment of a plurality of stacked die layers during a memory operation.

FIG. 7E depicts one embodiment of a plurality of stacked die layers during a memory operation. As depicted, each of the CMOS die layers include two different CMOS die. The memory array die 703 is arranged above the CMOS die 708 and 728. The CMOS die 707 and the CMOS die 727 are arranged above the memory array die 703. The memory array die 702 is arranged above the CMOS die 707 and the CMOS die 727. The CMOS die 706 and the CMOS die 726 are arranged above the memory array die 702. The memory array die 701 is arranged above the CMOS die 706 and the CMOS die 726. During the memory operation, the CMOS die 706-707 may be electrically connected to the memory array die 702 via the vertical TSV bus 723 and the CMOS die 726-727 may be electrically connected to the memory array die 702 via the vertical TSV bus 722. Therefore, memory array support circuitry from four CMOS die may be electrically connected to the memory array die 702 during the memory operation. In some embodiments, the memory operation may comprise a programming operation. During the programming operation, CMOS die 726-727 may generate programming voltages via voltage regulators and charge pumps located on the CMOS die 726-727 and CMOS die 706-707 may provide write circuitry and data buffering for the memory array die 702.

Figure 7F:
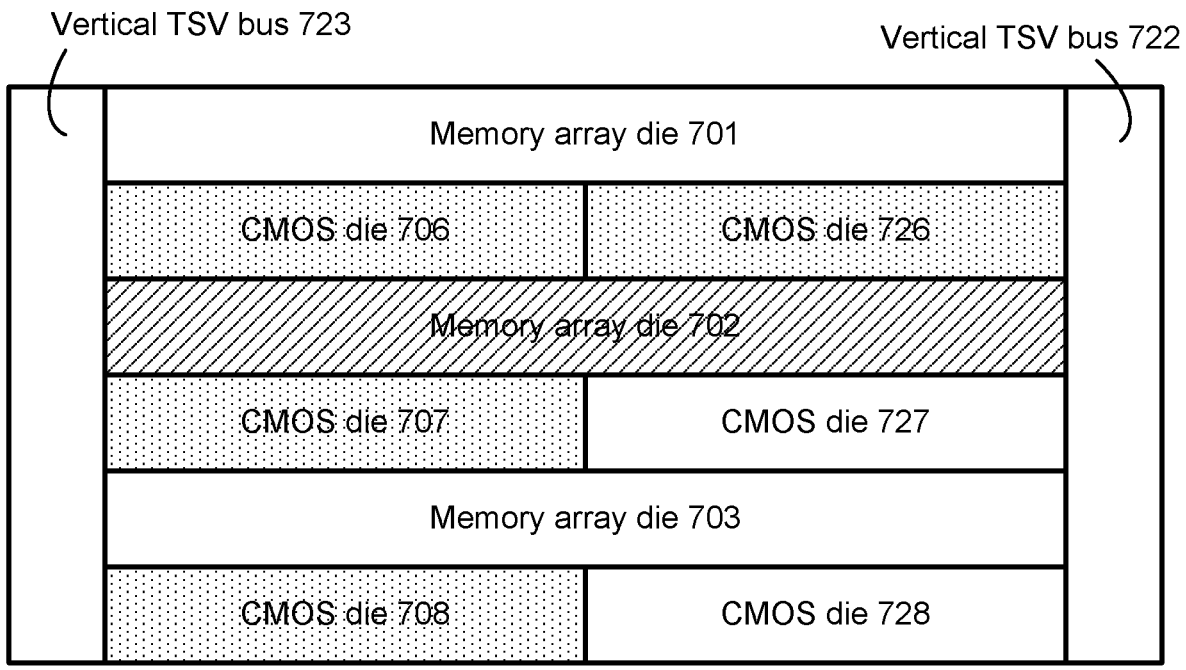
FIG. 7F depicts one embodiment of the plurality of stacked die layers depicted in FIG. 7E during a second memory operation.

FIG. 7F depicts one embodiment of the plurality of stacked die layers depicted in FIG. 7E during a second memory operation. The second memory operation may be performed subsequent to the memory operation depicted in FIG. 7E. As depicted in FIG. 7F, during the second memory operation, the CMOS die 706-708 and 726 have been electrically connected to the memory array die 702. The CMOS die 706-708 may electrically connect to the memory array die 702 via the vertical TSV bus 723 and the CMOS die 726 may electrically connect to the memory array die 702 via the vertical TSV bus 722. In this situation, two CMOS die for the layer with CMOS die 706 and 726 have been electrically connected to the memory array die 702 while only one CMOS die from the layers with CMOS die 707 and 708 have been electrically connected to the memory array die 702. The unequal die assignments per layer may be made via the vertical TSV busses 722-723 and the corresponding crossbar switches within each die of the plurality of stacked die.

Figure 7G:
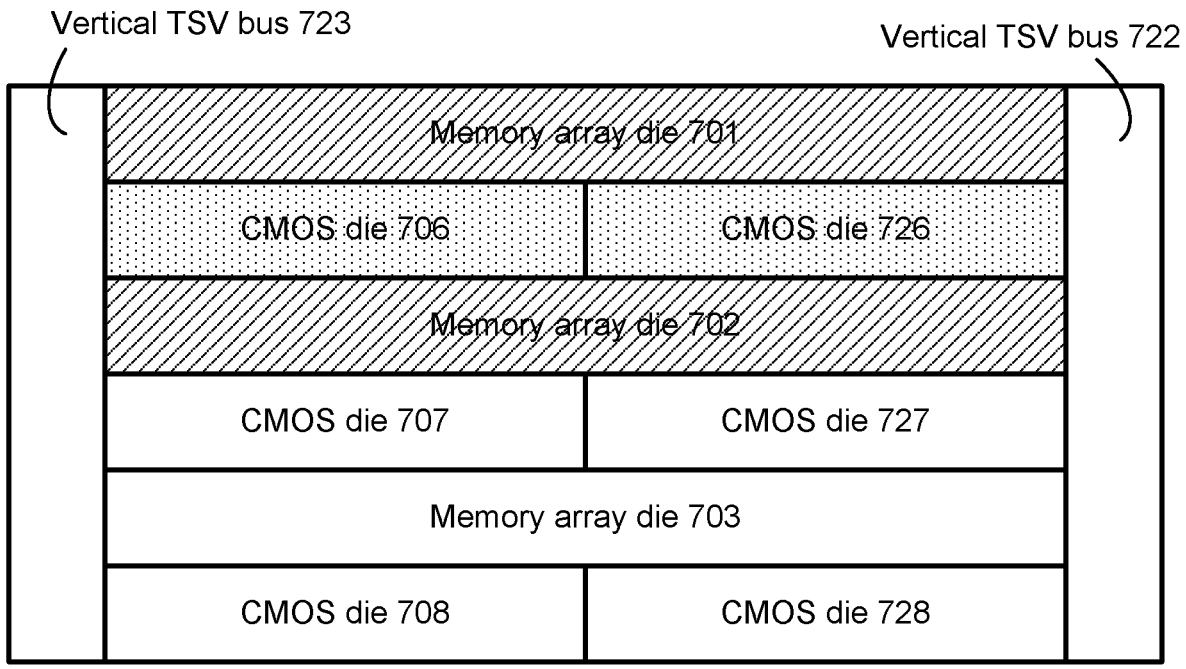
FIG. 7G depicts one embodiment of the plurality of stacked die layers depicted in FIG. 7E during two memory operations.

FIG. 7G depicts one embodiment of the plurality of stacked die layers depicted in FIG. 7E during two memory operations. As depicted, the CMOS die 706 may be paired with memory array die 702 during a first memory operation for the memory array die 702 (e.g., during a read operation for the memory array die 702) and the CMOS die 726 may be paired with memory array die 701 during a second memory operation for the memory array die 701 (e.g., during a write operation for the memory array die 701). A mapping circuit or controller arranged on a CMOS die, such as CMOS die 728, may determine that the first memory operation for the memory array die 702 and the second memory operation for the memory array die 701 should be concurrently performed and therefore assign one CMOS die to the memory array die 702 and another CMOS die to the memory array die 701.

In another embodiment, a mapping circuit or controller arranged on a CMOS die of the plurality of stacked die may determine that CMOS die 706 and CMOS die 726 should be timed shared between the memory array die 701 and the memory array die 702. In this case, the first memory operation for the memory array die 702 may be performed while both the CMOS die 706 and the CMOS die 726 are electrically connected to the memory array die 702; subsequently, the second memory operation for the memory array die 701 may be performed while both the CMOS die 706 and the CMOS 726 are electrically connected to the memory array die 701.

Figure 7H:
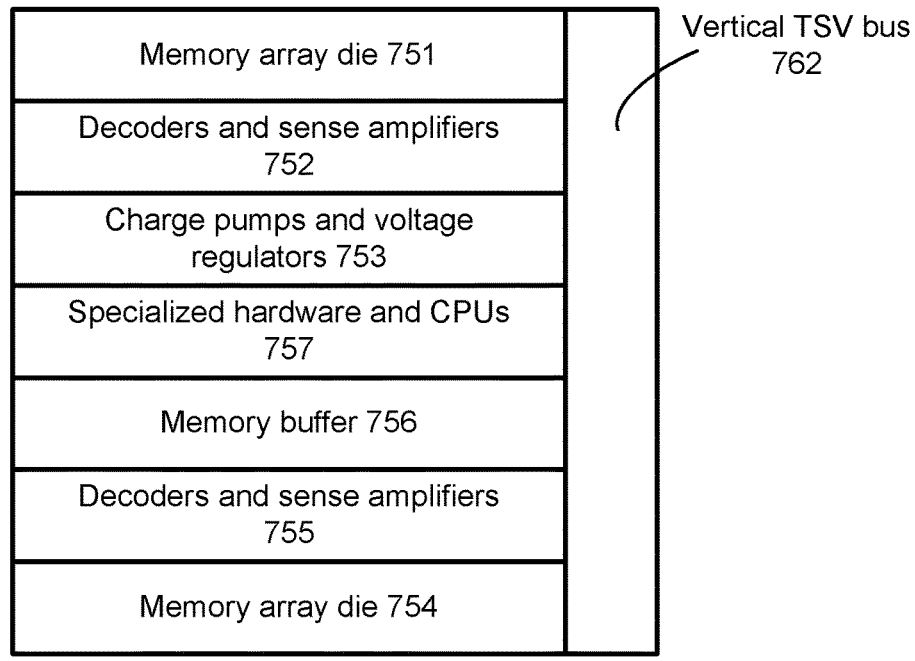
FIG. 7H depicts one embodiment of a plurality of stacked die that are in communication with each other via a vertical TSV bus.

FIG. 7H depicts one embodiment of a plurality of stacked die that are in communication with each other via a vertical TSV bus 762. The vertical TSV bus 762 may comprise a plurality of vertical TSV connections and switch transistors for selecting which die out of the plurality of stacked die are electrically connected to the plurality of vertical TSV connections. As depicted, the plurality of stacked die include memory array die 751 and 754 (e.g., comprising 3D BiCS memory arrays), memory buffer 756 (e.g., comprising a DRAM), specialized hardware and CPUs 757, decoders and sense amplifiers 752 and 755, and charge pumps and voltage regulators 753. A mapping circuit or controller may determine that the memory buffer 756 and charge pumps and voltage regulators 753 are to be electrically connected to the memory array die 751 during a first memory operation for the memory array die 751 (e.g., during a programming operation) while the decoders and sense amplifiers 755 are electrically connected to the memory array die 754 during a second memory operation for the memory array die 754 (e.g., during a read operation). In this case, the different CMOS die within the plurality of stacked die may include specific support circuitry such as charge pumps and sense amplifiers. One technical reason for separating the charge pumps from the sense amplifiers is that the layout area for the charge pumps may be much larger than the layout area for the sense amplifiers and therefore a greater number of sense amplifiers may be arranged on a dedicated die for decoders and sense amplifiers 755 if the die does not also need to provide voltage multiplication using charge pumps.

In some embodiments, the electrical components from one or more of the die within the plurality of stacked die depicted in FIG. 7H may be merged into a single die. For example, the memory buffer 756 and the charge pumps and voltage regulators 753 may be arranged on or provided by a single die. The specialized hardware and CPUs 757 may include one or more specialized cores to accelerate specific application domains (e.g., ECC, compressor, etc.) and/or one or more lightweight CPUs.

Figure 7I:
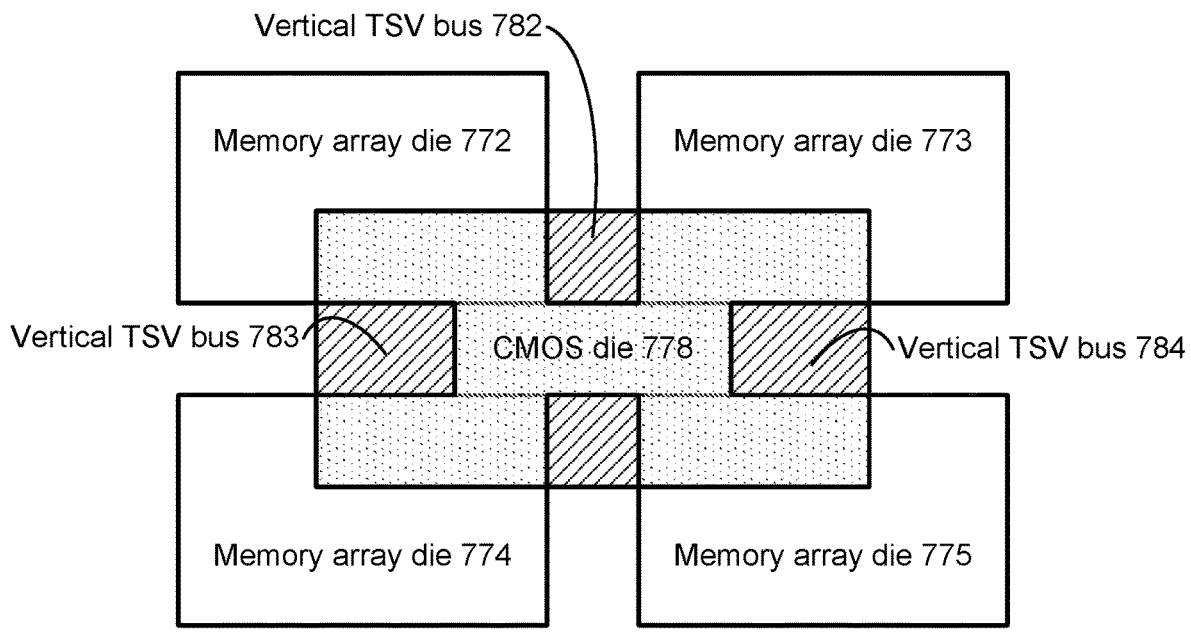
FIG. 7I depicts one embodiment of a group of four memory array dies arranged below a CMOS die.

FIG. 7I depicts one embodiment of four memory array die 772-775 arranged below a CMOS die 778. The CMOS die 778 may include four TSV bus regions including vertical TSV bus 782 and vertical TSV bus 783. The crossbar switches (e.g., transistors) for the vertical TSV busses may be arranged on the CMOS die 778. The vertical TSV bus 782 may allow memory array support circuitry arranged on the CMOS die 778 to electrically connect to either the memory array die 772 or the memory array die 773. The vertical TSV bus 783 may allow memory array support circuitry arranged on the CMOS die 778 to electrically connect to either the memory array die 772 or the memory array die 774. The vertical TSV bus 784 may allow memory array support circuitry arranged on the CMOS die 778 to electrically connect to either the memory array die 773 or the memory array die 775. In some cases not depicted, the vertical TSV bus 782 may extend below the layer with memory array die 772-775 to connect to another CMOS die arranged below the memory array die 772-775.

Figure 8A:
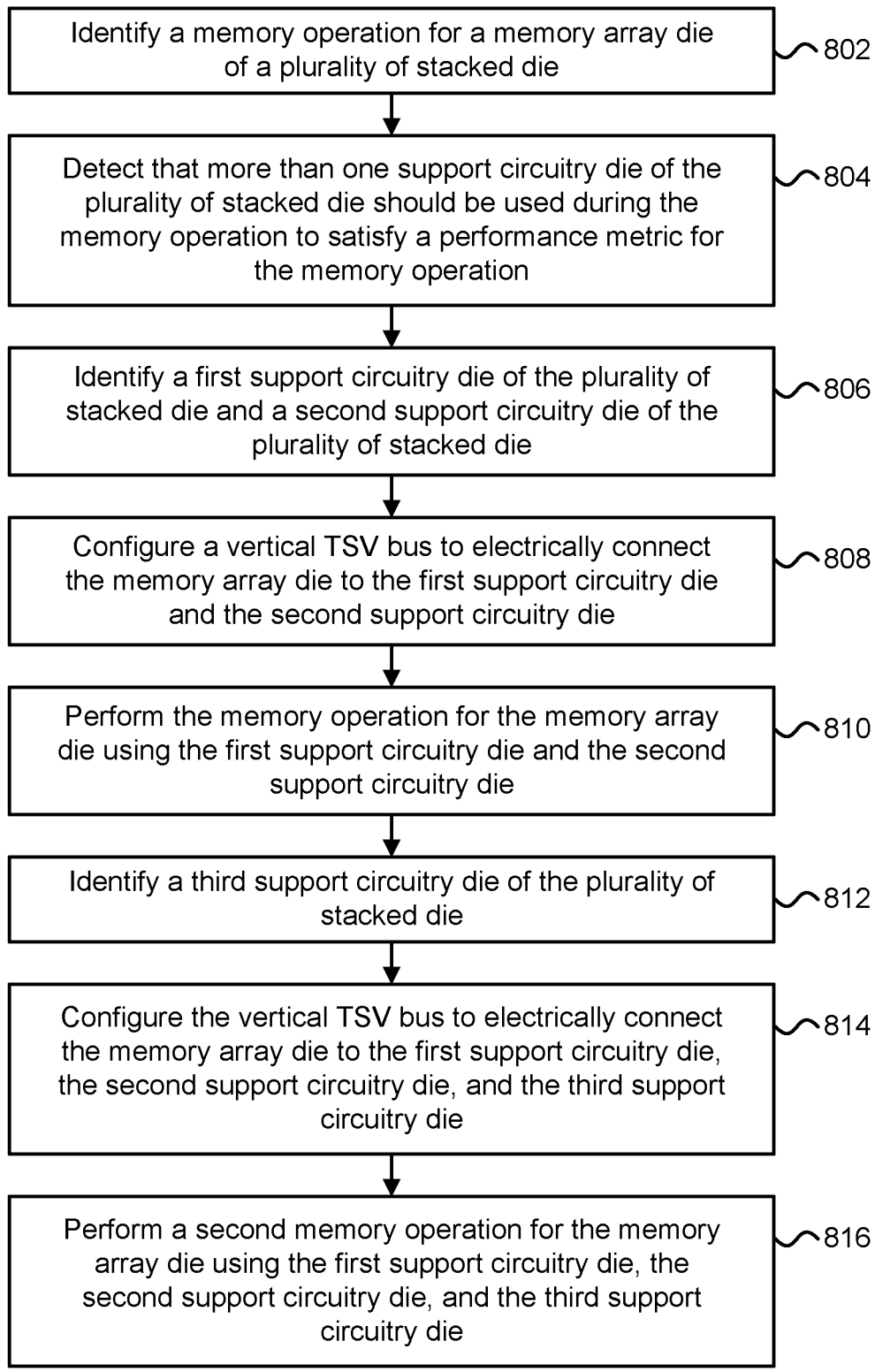
FIG. 8A is a flowchart describing one embodiment of a process for dynamically assigning one or more memory array die with one or more CMOS die during memory operations.

FIG. 8A is a flowchart describing one embodiment of a process for dynamically assigning one or more memory array die with one or more CMOS die during memory operations. In one embodiment, the process of FIG. 8A may be performed by control circuitry, such as control circuitry 310 depicted in FIG. 2A. In another embodiment, the process of FIG. 8A may be performed by one or more control circuits, such as controller 120 in FIG. 1. The process of FIG. 8A may also be performed using a controller or state machines arranged on a CMOS die, such as CMOS die 706 in FIG. 7B.

In step 802, a memory operation for a memory array die of a plurality of stacked die is identified. The plurality of stacked die may correspond with the plurality of stacked die depicted in FIGS. 7B-7I. The plurality of stacked die may include one or more support circuitry die and one or more memory array die. The one or more support circuitry die may correspond with the CMOS die 706-708 in FIG. 7B. The memory operation may comprise a read operation, a program verify operation, an erase operation, or a programming operation. In one example, the memory operation may be identified using a controller arranged on a die of the plurality of stacked die. In step 804, it is detected that more than one support circuitry die of the plurality of stacked die should be used during the memory operation to satisfy a performance metric for the memory operation. In one example, the memory operation may comprise a read operation and the performance metric may comprise a particular read throughput or read bandwidth. In another example, the memory operation may comprise a programming operation and the performance metric may comprise a particular write throughput or write bandwidth.

In step 806, a first support circuitry die of the plurality of stacked die and a second support circuitry die of the plurality of stacked die are identified. In this case, a mapping circuit or controller may determine that at least two support circuitry die are required for performing the memory operation such that the performance metric is satisfied. In one example, the first support circuitry die and the second support circuitry die may be arranged above the memory array die. In another example, the first support circuitry die may be arranged above the memory array die and the second support circuitry die may be arranged below the memory array die. In step 808, a vertical TSV bus is configured to electrically connect the memory array die to the first support circuitry die and the second support circuitry die. In one example, the memory array die may correspond with memory array die 702 in FIG. 7D, the first support circuitry die may correspond with CMOS die 706 in FIG. 7D, and the second support circuitry die may correspond with CMOS die 707 in FIG. 7D. In step 810, the memory operation for the memory array die is performed using memory array support circuitry from the first support circuitry die and the second support circuitry die. The memory array support circuitry may include control logic, page registers, sense amplifiers, charge pumps, voltage regulators, decoders, and bandgap voltage references. The memory operation for the memory array die may comprise a read operation in which sense amplifiers from both the first support circuitry die and the second support circuitry die are electrically connected to bit lines of a memory array located on the memory array die.

In step 812, a third support circuitry die of the plurality of stacked die is identified. In step 814, the vertical TSV bus is configured to electrically connect the memory array die to the first support circuitry die, the second support circuitry die, and the third support circuitry die. In one example, the memory die may correspond with memory array die 702 in FIG. 7F, the first support circuitry die may correspond with CMOS die 706 in FIG. 7F, the second support circuitry die may correspond with CMOS die 707 in FIG. 7F, and the third support circuitry die may correspond with CMOS die 708 in FIG. 7F. In step 816, a second memory operation for the memory array die may be performed using the first support circuitry die, the second support circuitry die, and the third support circuitry die. In one embodiment, the memory operation may comprise a read operation and the second memory operation may comprise a write operation. In another embodiment, the memory operation may comprise a read operation with a first read bandwidth and the second memory operation may comprise a read operation with a second read bandwidth greater than the first read bandwidth. In another embodiment, the memory operation may comprise a programming operation with a first programming bandwidth and the second memory operation may comprise a programming operation with a second programming bandwidth greater than the first programming bandwidth.

Figure 8B:
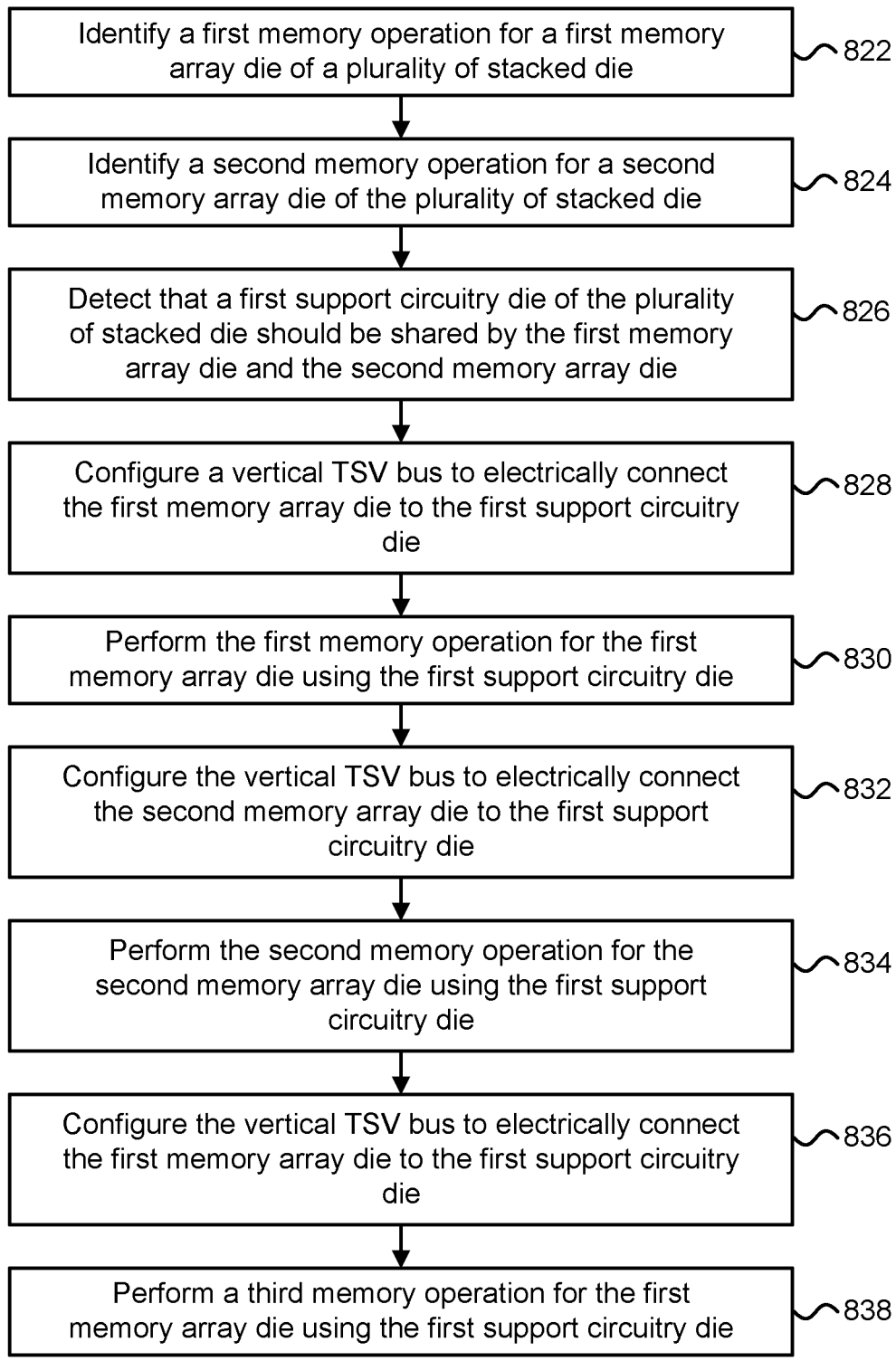
FIG. 8B is a flowchart describing another embodiment of a process for dynamically assigning one or more memory array die with one or more CMOS die during memory operations.

FIG. 8B is a flowchart describing another embodiment of a process for dynamically assigning one or more memory array die with one or more CMOS die during memory operations. In one embodiment, the process of FIG. 8B may be performed by control circuitry, such as control circuitry 310 depicted in FIG. 2A. In another embodiment, the process of FIG. 8B may be performed by one or more control circuits, such as controller 120 in FIG. 1. In another embodiment, the process of FIG. 8B may be performed using a controller or state machine arranged on a CMOS die, such as CMOS die 706 in FIG. 7B.

In step 822, a first memory operation for a first memory array die of a plurality of stacked die is identified. In step 824, a second memory operation for a second memory array die of the plurality of stacked die is identified. The first memory operation may comprise a read operation and the second memory operation may comprise a programming operation. In step 826, it is detected that a first support circuitry die of the plurality of stacked die should be shared by the first memory array die and the second memory array die. In step 828, a vertical TSV bus is configured to electrically connect the first memory array die to the first support circuitry die. In step 830, the first memory operation for the first memory array die is performed using memory array support circuitry from the first support circuitry die (e.g., sense amplifiers). In step 832, the vertical TSV bus is configured to electrically connect the second memory array die to the first support circuitry die. In step 834, the second memory operation for the second memory array die is performed using memory array support circuitry from the first support circuitry die (e.g., charge pumps). In step 836, the vertical TSV bus is configured to electrically connect the first memory array die to the first support circuitry die. In step 838, a third memory operation for the first memory array die is performed using circuitry located on the first support circuitry die. Therefore, support circuitry arranged on one or more CMOS die may be time shared among different memory array die within the plurality of stacked die.

Figure 8C:
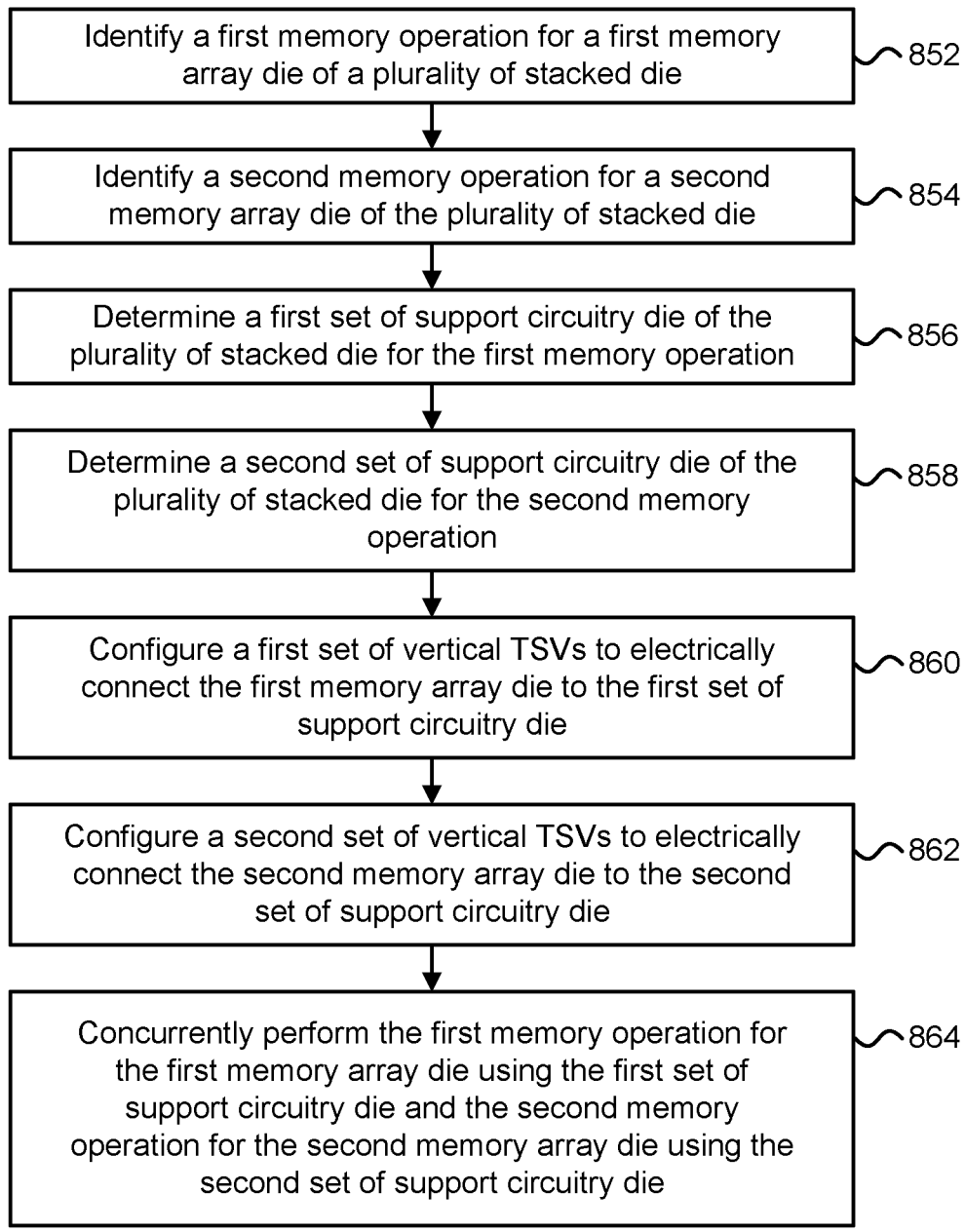
FIG. 8C is a flowchart describing an alternative embodiment of a process for dynamically assigning one or more memory array die with one or more CMOS die during memory operations.

FIG. 8C is a flowchart describing an alternative embodiment of a process for dynamically assigning one or more memory array die with one or more CMOS die during memory operations. In one embodiment, the process of FIG. 8C may be performed by control circuitry, such as control circuitry 310 depicted in FIG. 2A. In another embodiment, the process of FIG. 8C may be performed by one or more control circuits, such as controller 120 in FIG. 1. In another embodiment, the process of FIG. 8C may be performed using a controller or state machine arranged on a CMOS die, such as CMOS die 706 in FIG. 7B.

In step 852, a first memory operation for a first memory array die of a plurality of stacked die is identified. In step 854, a second memory operation for a second memory array die of the plurality of stacked die is identified. The plurality of stacked die may correspond with the plurality of stacked die depicted in FIG. 7B. In step 856, a first set of support circuitry die of the plurality of stacked die is determined for the first memory operation. The first set of support circuitry die may comprise one or more CMOS die. In step 858, a second set of support circuitry die of the plurality of stacked die is determined for the second memory operation. The second set of support circuitry die may comprise one or more other CMOS die. The number of CMOS die within the first set of support circuitry die may be greater than, equal to, or less than the number of CMOS die within the second set of support circuitry die. In step 860, a first set of vertical TSVs is configured to electrically connect the first memory array die to the first set of support circuitry die. The first set of vertical TSVs may be in communication with a set of crossbar switches or transistors that may be set to configure the reconfigurable electrical connections to the first memory array die. In step 862, a second set of vertical TSVs is configured to electrically connect the second memory array die to the second set of support circuitry die. In step 864, the first memory operation for the first memory array die is performed using the first set of support circuitry die while the second memory operation for the second memory array die is performed using the second set of support circuitry die. In this case, the first memory operation and the second memory operation may be performed concurrently or may overlap in time with each other.

One embodiment of the disclosed technology includes a plurality of stacked die including a first memory array die and a die mapping control circuit. The die mapping control circuit configured to identify a first memory operation for the first memory array die and determine a first set of support circuitry die of the plurality of stacked die for the first memory operation. The die mapping control circuit configured to set configurable electrical connections within the plurality of stacked die such that the first memory array die is electrically connected to memory array support circuitry within the first set of support circuitry die and cause the first memory operation for the first memory array die to be performed using the memory array support circuitry within the first set of support circuitry die.

One embodiment of the disclosed technology includes identifying a first memory operation for a first memory array die of a plurality of stacked die, identifying a second memory operation for a second memory array die of the plurality of stacked die, detecting that a first support circuitry die of the plurality of stacked die should be time shared by the first memory array die and the second memory array die, setting configurable electrical connections such that memory cells within the first memory array die are electrically connected to memory array support circuitry within the first support circuitry die, performing the first memory operation for the first memory array die while the memory cells within the first memory array die are electrically connected to the memory array support circuitry within the first support circuitry die, adjusting the configurable electrical connections such that memory cells within the second memory array die are electrically connected to the memory array support circuitry within the first support circuitry die, and performing the second memory operation for the second memory array die while the memory cells within the second memory array die are electrically connected to the memory array support circuitry within the first support circuitry die.

One embodiment of the disclosed technology includes a controller and a plurality of vertically stacked die including a first memory array die and a first CMOS die. The controller may comprise one or more control circuits. The controller configured to detect that a first memory operation is to be performed using the first memory array die and identify the first CMOS die in response to detection that the first memory operation is to be performed using the first memory array die. The controller configured to cause memory cell sensing circuitry arranged on the first CMOS die to be electrically connected to one or more memory cells arranged on the first memory array die. The controller configured to cause memory cell currents associated with the one or more memory cells arranged on the first memory array die to be sensed using the memory cell sensing circuitry arranged on the first CMOS die during the first memory operation.

For purposes of this document, a first layer may be over or above a second layer if zero, one, or more intervening layers are between the first layer and the second layer.

For purposes of this document, it should be noted that the dimensions of the various features depicted in the figures may not necessarily be drawn to scale.

For purposes of this document, reference in the specification to "an embodiment," "one embodiment," "some embodiments," or "another embodiment" may be used to describe different embodiments and do not necessarily refer to the same embodiment.

For purposes of this document, a connection may be a direct connection or an indirect connection (e.g., via another part). In some cases, when an element is referred to as being connected or coupled to another element, the element may be directly connected to the other element or indirectly connected to the other element via intervening elements. When an element is referred to as being directly connected to another element, then there are no intervening elements between the element and the other element.

Two devices may be "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus, comprising:
   a plurality of stacked die including a first memory array die; and
   a die mapping control circuit configured to identify a first memory operation for the first memory array die and determine a first set of support circuitry die of the plurality of stacked die for the first memory operation, the die mapping control circuit configured to set configurable electrical connections within the plurality of stacked die such that the first memory array die is electrically connected to memory array support circuitry within the first set of support circuitry die and cause the first memory operation for the first memory array die to be performed using the memory array support circuitry within the first set of support circuitry die.

2. The apparatus of claim 1, wherein:
   the memory array support circuitry within the first set of support circuitry die includes sensing circuitry for sensing memory cell currents associated with memory cells within the first memory array die.

3. The apparatus of claim 1, wherein:
the die mapping control circuit configured to detect that more than one support circuitry die of the plurality of stacked die should be used during the first memory operation to satisfy a performance metric for the first memory operation and determine the first set of support circuitry die in response to detection that more than one support circuitry die should be used during the first memory operation.

4. The apparatus of claim 3, wherein:
the first set of support circuitry die comprises two support circuitry die.

5. The apparatus of claim 3, wherein:
the performance metric for the first memory operation comprises meeting at least a particular read bandwidth.

6. The apparatus of claim 1, wherein:
the first memory operation comprises a read operation.

7. The apparatus of claim 1, wherein:
the die mapping control circuit is arranged on one of the first set of support circuitry die.

8. The apparatus of claim 1, wherein:
the die mapping control circuit is configured to identify a second memory operation for a second memory array die of the plurality of stacked die and determine a second set of support circuitry die of the plurality of stacked die for the second memory operation.

9. The apparatus of claim 7, wherein:
the die mapping control circuit is configured to cause the second memory operation for the second memory array die to be performed using memory array support circuitry within the second set of support circuitry die, the second memory operation for the second memory array die and the first memory operation for the first memory array die are performed concurrently.

10. The apparatus of claim 1, wherein:
the first memory array die includes vertical NAND strings.

11. A method, comprising:
identifying a first memory operation for a first memory array die of a plurality of stacked die;
identifying a second memory operation for a second memory array die of the plurality of stacked die;
detecting that a first support circuitry die of the plurality of stacked die should be time shared by the first memory array die and the second memory array die;
setting configurable electrical connections such that memory cells within the first memory array die are electrically connected to memory array support circuitry within the first support circuitry die;
performing the first memory operation for the first memory array die while the memory cells within the first memory array die are electrically connected to the memory array support circuitry within the first support circuitry die;
adjusting the configurable electrical connections such that memory cells within the second memory array die are electrically connected to the memory array support circuitry within the first support circuitry die; and
performing the second memory operation for the second memory array die while the memory cells within the second memory array die are electrically connected to the memory array support circuitry within the first support circuitry die.

12. The method of claim 11, wherein:
the setting the configurable electrical connections causes sensing circuitry within the first support circuitry die to be electrically connected to the memory cells within the first memory array die.

13. The method of claim 11, wherein:
the setting the configurable electrical connections includes setting crossbar switches located within one or more of the plurality of stacked die.

14. The method of claim 11, wherein:
the first memory operation comprises a read operation.

15. The method of claim 14, wherein:
the second memory operation comprises a programming operation.

16. The method of claim 11, wherein:
the first memory array die includes vertical NAND strings.

17. An apparatus, comprising:
a plurality of vertically stacked die including a first memory array die and a first CMOS die; and
a control circuit configured to detect that a first memory operation is to be performed using the first memory array die and identify the first CMOS die in response to detection that the first memory operation is to be performed using the first memory array die, the control circuit configured to cause memory cell sensing circuitry arranged on the first CMOS die to be electrically connected to one or more memory cells arranged on the first memory array die, the control circuit configured to cause memory cell currents associated with the one or more memory cells arranged on the first memory array die to be sensed using the memory cell sensing circuitry arranged on the first CMOS die during the first memory operation.

18. The apparatus of claim 17, wherein:
the memory cell sensing circuitry comprises a sense amplifier.

19. The apparatus of claim 17, wherein:
the first memory operation comprises a read operation.

20. The apparatus of claim 17, wherein:
the control circuit is arranged on the first CMOS die.

* * * * *